United States Patent
Iida et al.

(10) Patent No.: US 8,368,073 B2
(45) Date of Patent: Feb. 5, 2013

(54) DISPLAY DEVICE AND ELECTRONIC APPARATUS

(75) Inventors: Yukihito Iida, Kanagawa (JP); Masatsugu Tomida, Kanagawa (JP)

(73) Assignee: Sony Corporation (JP)

( * ) Notice: Subject to any disclaimer, the term of this patent is extended or adjusted under 35 U.S.C. 154(b) by 375 days.

(21) Appl. No.: 12/655,974

(22) Filed: Jan. 12, 2010

(65) Prior Publication Data

US 2010/0182224 A1    Jul. 22, 2010

(30) Foreign Application Priority Data

Jan. 16, 2009   (JP) .............................. P2009-007344

(51) Int. Cl.
*H01L 29/04* (2006.01)
(52) U.S. Cl. ............... 257/59; 257/72; 345/76; 345/80
(58) Field of Classification Search ............... 257/59, 257/72; 345/76, 80
See application file for complete search history.

(56) References Cited

U.S. PATENT DOCUMENTS

| | | | |
|---|---|---|---|
| 6,583,581 B2 * | 6/2003 | Kaneko et al. | 315/169.3 |
| 2006/0176250 A1 * | 8/2006 | Nathan et al. | 345/76 |
| 2008/0030437 A1 * | 2/2008 | Iida et al. | 345/80 |
| 2009/0102760 A1 | 4/2009 | Yamashita et al. | |
| 2009/0315814 A1 | 12/2009 | Tomida et al. | |

FOREIGN PATENT DOCUMENTS

JP   2006-133542 A   5/2006

OTHER PUBLICATIONS

European Search Report 09180994, dated Apr. 26, 2010.

* cited by examiner

*Primary Examiner* — Jenny L Wagner
*Assistant Examiner* — Mark Tornow
(74) *Attorney, Agent, or Firm* — Lerner, David, Littenberg, Krumholz & Mentlik, LLP

(57) ABSTRACT

A display device includes: a pixel array unit having pixels including a circuit configuration, in which a first electrode of an electro-optical element and a source electrode of a driving transistor are connected together, a gate electrode of the driving transistor and a source electrode or a drain electrode of a writing transistor are connected together, a holding capacitor is connected between the gate electrode and the source electrode, and an auxiliary capacitor is connected between the first electrode and a second electrode, disposed in a matrix shape. A signal line used for transmitting a video signal is disposed between adjacent pixels, and from one pixel of adjacent pixels to an area of the other pixel, the auxiliary capacitor of the one pixel is set to be disposed. One electrode of the auxiliary capacitor disposed on the signal line side is conductive with the second electrode of the electro-optical element.

5 Claims, 18 Drawing Sheets

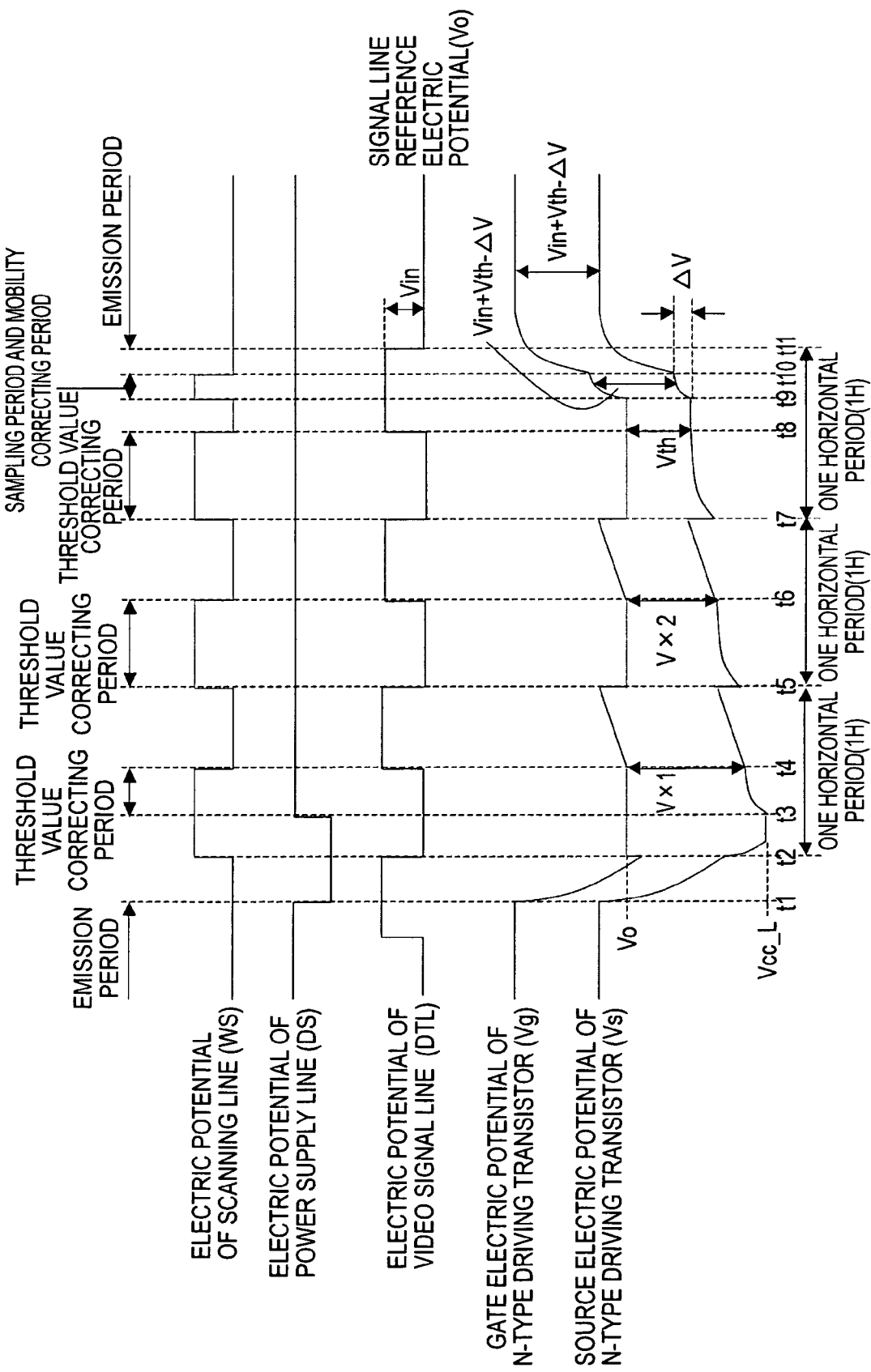

BEFORE t=t1 t=t1 t=t2 t=t3 t=t4 t=t5 t=t6 t=t7

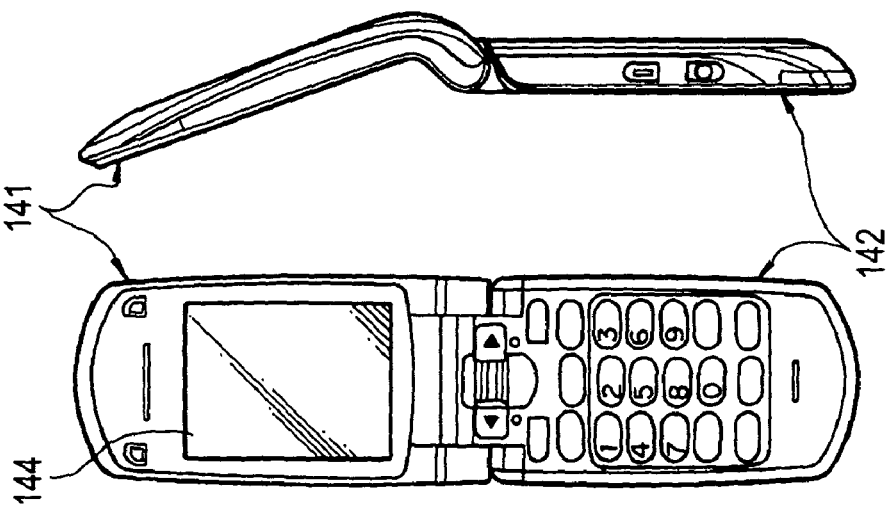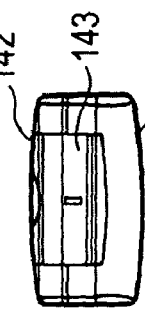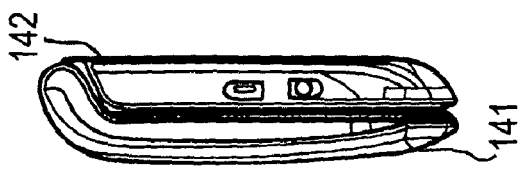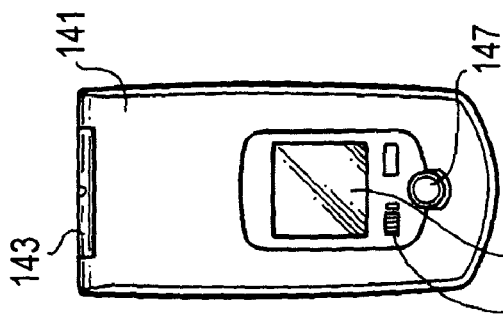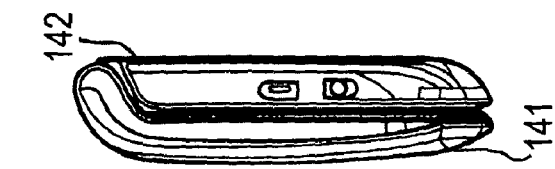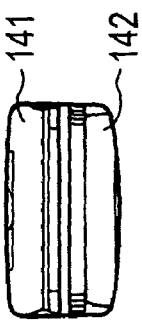

DISPLAY DEVICE AND ELECTRONIC APPARATUS

CROSS-REFERENCE TO RELATED APPLICATION

The present application claims priority from Japanese Patent Application No. JP 2009-007344 filed in the Japanese Patent Office on Jan. 16, 2009, the entire content of which is incorporated herein by reference.

BACKGROUND OF THE INVENTION

1. Field of the Invention

The present invention relates to a display device and an electronic apparatus, and more particularly, to a flat type (flat panel type) display device and an electronic apparatus formed by disposing pixels including electro-optical elements in a matrix form.

2. Description of the Related Art

Recently, in the field of display devices that perform image display, flat type display devices formed by disposing pixels (pixel circuits) including light emitting elements in a matrix form have been spreading rapidly. As the flat type display devices, organic EL display devices using organic EL (electroluminescence) elements that utilize a phenomenon of light emission at the time of applying an electric field, for example, to an organic thin film have been developed and commercialized.

The organic EL display device has the following features. The organic EL element can be driven by an application voltage of 10 V or less, and thus has low power consumption. In addition, since the organic EL element is a self-luminous element, the organic EL display does not need a light source (back light) that may be essential to a liquid crystal display device. In addition, the response speed of the organic EL element is very high with response time of several microseconds, and accordingly, no afterimage occurs at the time of displaying a motion picture.

Similarly to the liquid crystal display device, a simple (passive) matrix type or an active matrix type may be used as a driving method of the organic EL display device. Recently, active matrix-type display devices in which an active element such as an insulated gate-type field effect transistor (generally, TFT (thin film transistor)) is disposed in a pixel circuit have been actively developed.

It is generally known that the I-V characteristics (current-voltage characteristics) of the organic EL element degrade as time elapses (so-called degradation over time). In addition, a threshold voltage Vth of a driving transistor or the mobility $\mu$ of a semiconductor thin film that configures a channel of the driving transistor (hereinafter, described as "mobility of a driving transistor") changes over time or may be different for each pixel due to a deviation in the manufacturing process thereof.

Accordingly, in order to maintain emission luminance of the organic EL element to be constant without being affected by the above-described factors, a configuration in which a compensation function for characteristic variances in the organic EL element and correction functions including a correction function for variances in the threshold voltage Vth of the driving transistor (hereinafter, described as "threshold value correction") or a correction function for variances in the mobility $\mu$ of the driving transistor are included in each pixel circuit has been used (for example, see JP-A-2006-133542).

SUMMARY OF THE INVENTION

Here, in a pixel layout in related art, pixels are disposed such that the TFT layout area is asymmetric in accordance with the size (constant) of each pixel circuit. On the other hand, second wirings are disposed at an equal pitch. Thus, when the size of a constituent element of a specific pixel is larger than that of a different pixel so as to increase the layout density thereof, a part of the constituent element having high layout density is disposed in a space of a pixel having low layout density. In such a case, polysilicon that forms a middle layer passes below a video signal line that is a second wiring disposed between pixels. In a case where the electric potential of the polysilicon is the anode electric potential, there is a problem that a decrease in the luminance occurs due to capacitive coupling that is caused by parasitic capacitance generated between the video signal line and the anode.

Therefore, there is a need for providing technology for preventing a decrease in the luminance due to capacitive coupling by evading formation of parasitic capacitance between a video signal line and an anode.

According to an embodiment of the present invention, there is provided a display device including: a pixel array unit having pixels including a circuit configuration, in which a first electrode of an electro-optical element and a source electrode of a driving transistor are connected together, a gate electrode of the driving transistor and a source electrode or a drain electrode of a writing transistor are connected together, a holding capacitor is connected between the gate electrode and the source electrode of the driving transistor, and an auxiliary capacitor is connected between the first electrode and a second electrode of the electro-optical element, disposed in a matrix shape. A signal line used for transmitting a video signal is disposed between adjacent pixels, and, from one pixel of adjacent pixels to an area of the other pixel, the auxiliary capacitor of the one pixel is set to be disposed, and one electrode of the auxiliary capacitor that is disposed on the signal line side is conductive with the second electrode of the electro-optical element. The embodiment of the invention also provides an electronic apparatus that has the above-described display device disposed in a main body casing.

According to the above-described embodiments of the present invention, by using a configuration in which the auxiliary capacitor is disposed in an adjacent pixel through the lower side of the signal line used for transmitting a video signal, one electrode, which is disposed on the signal line side, of the electrodes of the auxiliary capacitor is allowed to be conductive with the second electrode of the electro-optical element. In other words, of the electrodes of the auxiliary capacitor, one electrode disposed on the signal line side has the cathode electric potential, and the other electrode of the auxiliary capacitor has the anode electric potential. Accordingly, an area between the signal line and the anode electric potential is shielded by the cathode electric potential, whereby formation of parasitic capacitance between the signal line and the anode is prevented.

According to the embodiment of the invention, in a circuit configuring a pixel, by avoiding formation of parasitic capacitance between a signal line and an anode, a decrease in the luminance due to capacitive coupling can be prevented.

BRIEF DESCRIPTION OF THE DRAWINGS

FIG. 3 is a timing waveform chart for illustrating the operation of an organic EL display device of the active matrix type that serves as a premise of an embodiment of the invention.

FIG. 17A is a perspective view viewed from the front side, and FIG. 17B is a perspective view viewed from the rear side.

FIGS. 20A to 20G are diagrams showing the outer appearances of a cellular phone, to which this embodiment is applied. FIG. 20A is a front view in an open state, FIG. 20B is a side view thereof, FIG. 20C is a front view in a closed state, FIG. 20D is a left side view, FIG. 20E is a right side view, FIG. 20F is a top view, and FIG. 20G is a bottom view.

DESCRIPTION OF THE PREFERRED EMBODIMENTS

Hereinafter, an embodiment of the present invention (hereinafter, referred to as an "embodiment") will be described. The description thereof will be followed in the following order.

1. Display Device (System Configuration, Pixel Circuit, and Circuit Operation) As Premise of This Embodiment
2. Problem in Pixel Structure in Related Art (Layout of Pixel Circuit, Equivalent Circuit, and Timing Chart)
3. Configuration Example According to This Embodiment (System Configuration, Wiring Structure, and Timing Chart)
4. Applications (Various Applications to Electronic Apparatuses)

1. Display Device (System Configuration, Pixel Circuit, and Circuit Operation) as Premise of this Embodiment System Configuration FIG. 1 is a schematic diagram of a system configuration that represents an active-matrix type display device serves as a premise of this embodiment.

Here, as an example, an organic EL display device of an active-matrix type that uses an electro-optical element of a current-driven type of which emission luminance changes in accordance with the value of a current flowing through the device such as an organic EL element (organic electroluminescence element) as a light emitting element will be described.

Figure 1:
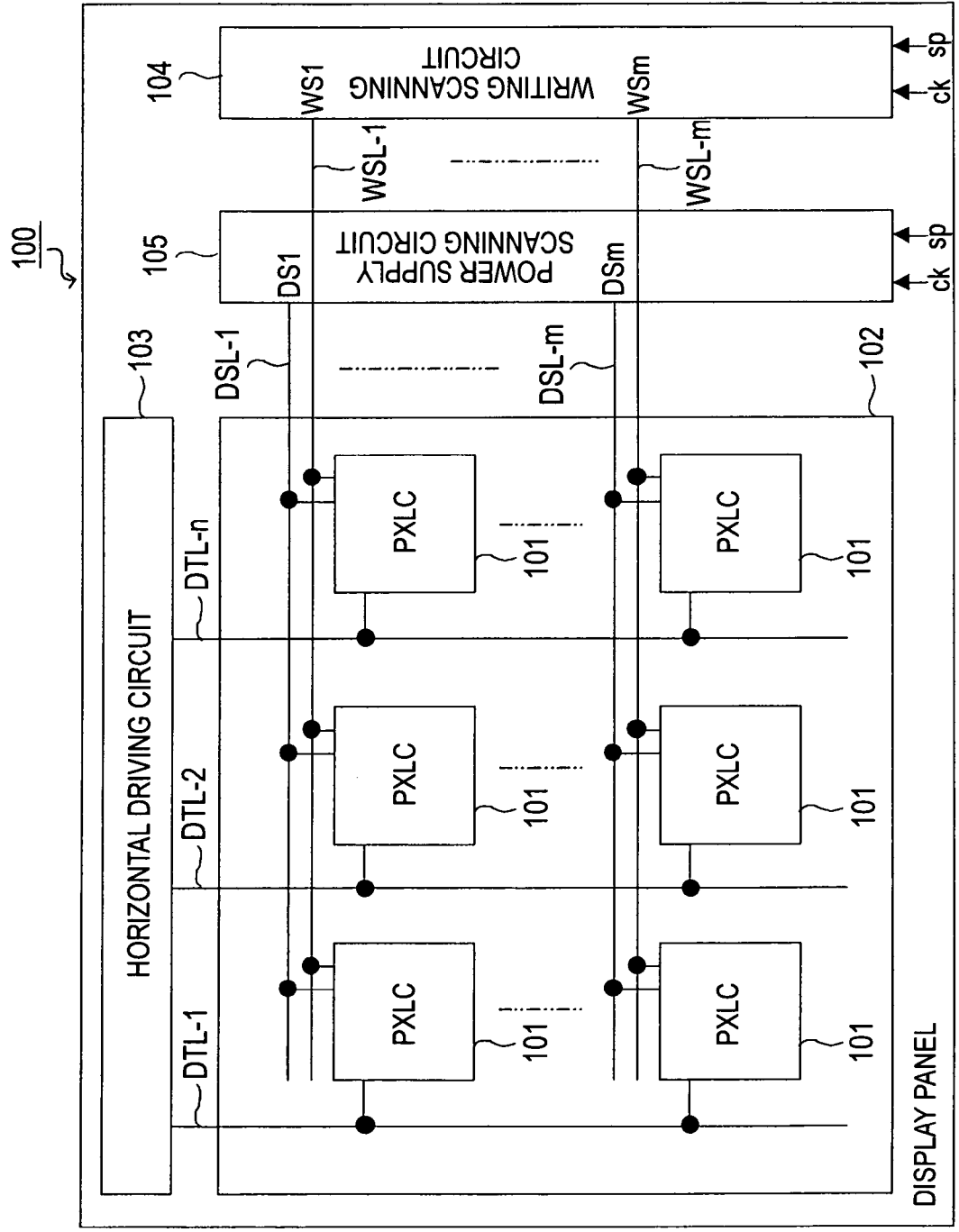
FIG. 1 is a schematic diagram of a system configuration that represents an active-matrix type organic EL display device that serves as a premise of an embodiment of the present invention.

As represented in FIG. 1, an organic EL display device 100 has a configuration including a pixel array unit 102 formed by two-dimensionally disposing pixels (PXLC) 101 in a matrix shape and a driving unit that is disposed on the periphery of the pixel array unit 102 and drives each pixel 101. As the driving unit that drives the pixels 101, for example, a horizontal driving circuit 103, a writing scanning circuit 104, and a power supply scanning circuit 105 are disposed.

In the pixel array unit 102, in the pixel array of m rows and n columns, scanning lines WSL-1 to WSL-m and power supply lines DSL-1 to DSL-m are wired for each pixel row, and signal lines DTL-1 to DTL-n are wired for each pixel column.

The pixel array unit 102, generally, is formed on a transparent insulating substrate such as a glass substrate and has a flat-type panel structure. Each pixel 101 of the pixel array unit 102 may be formed by an amorphous silicon TFT (thin film transistor) or a low-temperature poly silicon TFT. When the low-temperature polysilicon TFT is used, the horizontal driving circuit 103, the writing scanning circuit 104, and the power supply scanning circuit 105 can also be mounted on a display panel (substrate) that forms the pixel array unit 102.

The writing scanning circuit 104 is configured by a shift register that sequentially shifts (transmits) start pulses sp in synchronization with a clock pulse ck or the like. The writing scanning circuit 104 supplies pulses (scanning signals) WS1 to WSm by sequentially writing the pulses into the scanning lines WSL-1 to WSL-m when a video signal is written into each pixel 101 of the pixel array unit 102, whereby sequentially scanning (line sequential scanning) the pixels 101 of the pixel array unit 102 in units of one row.

The power supply scanning circuit 105 is configured by a shift register that sequentially shifts the start pulses sp in synchronization with the clock pulse ck or the like. The power supply scanning circuit 105 selectively supplies power supply line electric potentials DS1 to DSm that are shifted between a first electric potential Vcc_H and a second electric potential Vcc_L lower than the first electric potential Vcc_H to the power supply lines DSL-1 to DSL-m in synchronization with line sequential scanning performed by the writing scanning circuit 104. Accordingly, the power supply scanning circuit 105 controls emission or non-emission of the pixels 101.

The horizontal driving circuit 103 appropriately selects either a signal voltage Vsig of a video signal (hereinafter, it may be also referred to as only a "signal voltage") corresponding to luminance information that is supplied from a signal supply source (not shown) or a signal line reference electric potential Vo so as to be written into the pixels 101 of the pixel array unit 102 through the signal lines DTL-1 to DTL-n, for example, in units of one row. In other words, the horizontal driving circuit 103 employs a driving form of the line sequential writing type in which a signal voltage Vin of a video signal is written in units of one row (line).

Here, the signal line reference electric potential Vo is a voltage (for example, a voltage corresponding to a black level) that becomes a reference for the signal voltage Vin of the video signal. In addition, the second electric potential Vcc_L is set to an electric potential that is lower than the signal line reference electric potential Vo, for example, an electric potential that is lower than "Vo–Vth" wherein a threshold voltage of a driving transistor is denoted by Vth. More preferably, the second voltage Vcc_L is set to an electric potential that is sufficiently lower than "Vo–Vth".

Pixel Circuit

Figure 2:
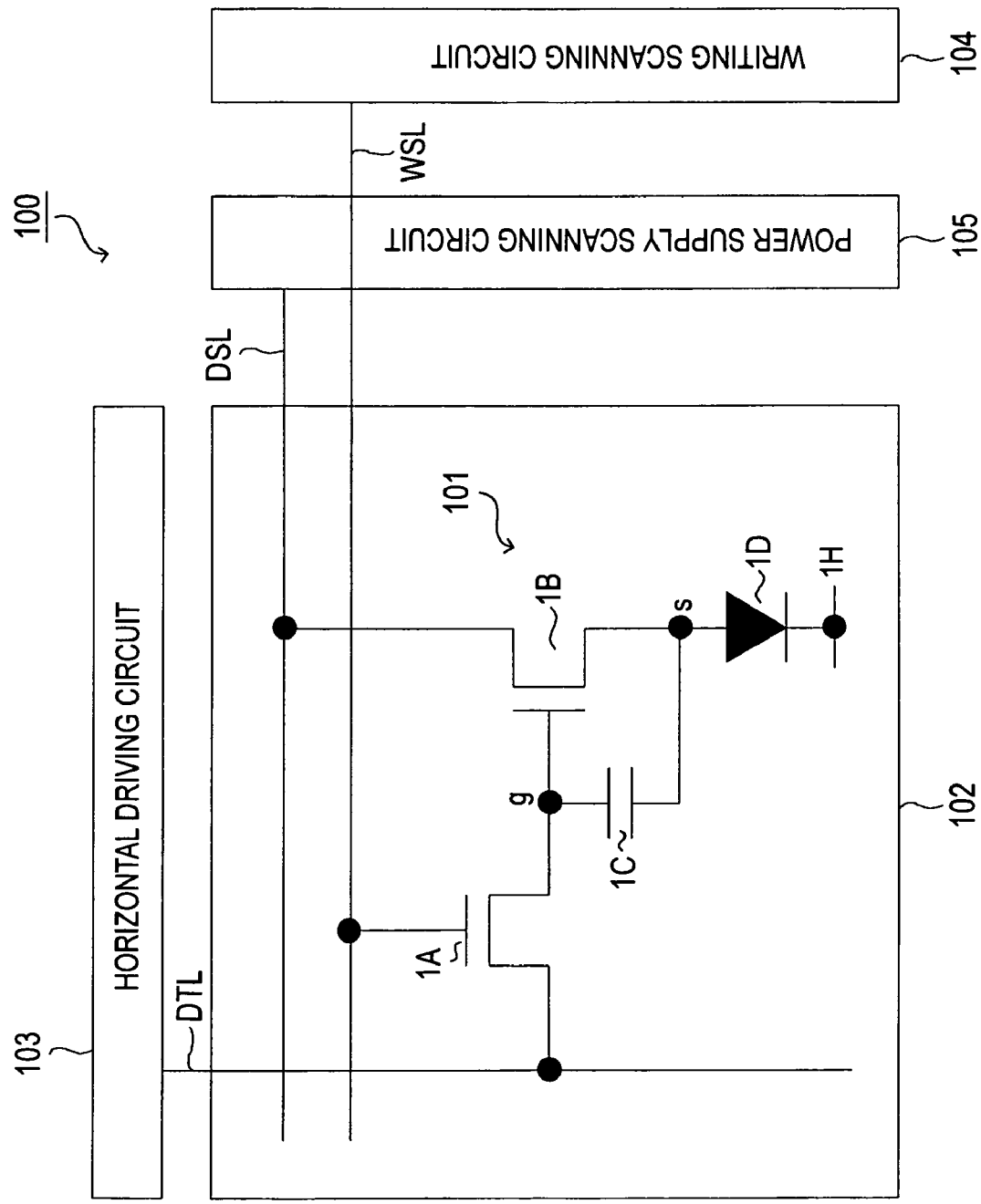
FIG. 2 is a circuit diagram representing a concrete example of the configuration of a pixel (pixel circuit).

FIG. 2 is a circuit diagram representing a concrete example of the configuration of the pixel (pixel circuit).

As shown in FIG. 2, the pixel 101 has a pixel configuration in which an electro-optical element of the current-driven type, in which the emission luminance changes in accordance with the value of a current flowing through the device, for example, an organic EL element 1D is included as a light emitting element, and a driving transistor 1B, a writing transistor 1A, and a holding capacitor 1C are included in addition to the organic EL element 1D. In other words, the pixel 101 has a 2Tr/1C pixel configuration that is configured by two transistors (Tr) and one capacitor (C).

In the pixel 101 having such a configuration, N-channel TFTs are used as the driving transistor 1B and the writing transistor 1A. However, the combination of conductive types of the driving transistor 1B and the writing transistor 1A described here is merely an example, and an embodiment of the invention is not limited to such a combination.

The organic EL element 1D has a cathode electrode connected to a common power supply line 1H that is wired commonly to all the pixels 101. The driving transistor 1B has a source electrode connected to the anode electrode of the organic EL element 1D and a drain electrode connected to the power supply lines DSL (DSL-1 to DSL-m).

The writing transistor 1A has a gate electrode connected to the scanning line WSL (WSL-1 to WSL-m), one electrode (a source electrode or a drain electrode) connected to the signal line DTL (DTL-1 to DTL-n), and the other electrode (the drain electrode or the source electrode) connected to the gate electrode of the driving transistor 1B.

The holding capacitor 1C has one electrode connected to the gate electrode of the driving transistor 1B and the other electrode connected to the source electrode of the driving transistor 1B (the anode electrode of the organic EL element 1D). In addition, an auxiliary capacitor 1J has one electrode connected to the anode electrode of the organic EL element 1D and the other electrode connected to the cathode electrode of the organic EL element 1D.

In the pixel 101 having the 2Tr/1C pixel configuration, the writing transistor 1A is in a conducting state in response to a scanning signal WS applied to the gate electrode from the writing scanning circuit 104 through the scanning line WSL. Accordingly, the writing transistor 1A samples a signal voltage Vin of a video signal corresponding to the luminance information supplied from the horizontal driving circuit 103 through the signal line DTL or the signal line reference electric potential Vo so as to be written into the pixel 101.

The written signal voltage Vin or the signal line reference electric potential Vo is applied to the gate electrode of the driving transistor 1B, and is maintained in the holding capacitor 1C. When the electric potential DS of the power supply line DSL (DSL-1 to DSL-m) is the first electric potential Vcc_H, the driving transistor 1B is supplied with a current from the power supply line DSL and supplies a driving current having a current value corresponding to the voltage value of the signal voltage Vin maintained in the holding capacitor 1C to the organic EL element 1D, whereby driving the organic EL element 1D by the current so as to emit light.

Circuit Operation of Organic EL Display Device

Next, the circuit operation of the organic EL display device 100 having the above-described configuration will be described based on a timing waveform chart represented in FIG. 3 with reference to operation explanatory diagrams represented in FIGS. 4A to 6C. Incidentally, in the operation explanatory diagrams represented in FIGS. 4A to 6C, the writing transistor 1A is denoted by the symbol of a switch in order to simplify the drawings. In addition, since the organic EL element 1D has a capacitance component, an EL capacitance 1I is also shown in the diagrams.

The timing waveform chart represented in FIG. 3 shows changes in the electric potential (writing pulse) WS of the scanning line WSL (WSL-1 to WSL-m), changes in the electric potential DS (Vcc_H and Vcc_L) of the power supply line DSL (DSL-1 to DSL-m), and changes in the gate electric potential Vg and the source electric potential Vs of the driving transistor 1B.

Emission Period

The organic EL element 1D is in a light emitting state before time t1 in the timing waveform chart of FIG. 3 (emission period). During this emission period, the electric potential DS of the power supply line DSL is the first electric potential Vcc_H, and the writing transistor 1A is in a non-conducting state.

Figure 4A:
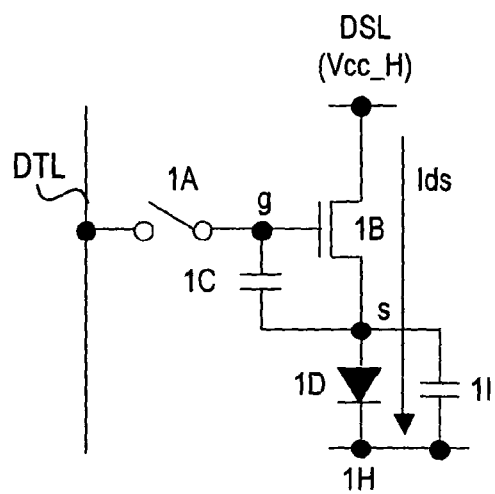
FIGS. 4A to 4D are explanatory diagrams (first example) illustrating the circuit operation of an organic EL display device of the active matrix type that serves as a premise of an embodiment of the invention.

At this moment, since the driving transistor 1B is set to operate in a saturation region, as shown in FIG. 4A, a driving current (drain-to-source current) Ids corresponding to the gate-to-source voltage Vgs of the driving transistor 1B is supplied from the power supply line DSL through the driving transistor 1B to the organic EL element 1D. Accordingly, the organic EL element 1D emits light at a luminance level corresponding to the value of the current of the driving current Ids.

Threshold Value Correction Preparatory Period

Figure 4B:
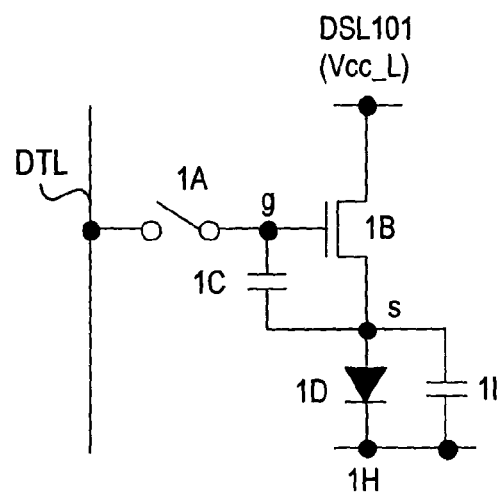

Then, a new field of line-sequential scanning begins at time t1. Thus, as shown in FIG. 4B, the electric potential DS of the power supply line DSL changes from the first electric potential (hereinafter referred to as a "high electric potential") Vcc_H to the second electric potential (hereinafter, referred to as a "low electric potential") Vcc_L that is sufficiently lower than the signal line reference voltage Vo–Vth of the signal line DTL.

Here, letting Vel be the threshold voltage of the organic EL element 1D and Vcath be the electric potential of the common power supply line 1H, when the low electric potential Vcc_L satisfies the relation of Vcc_L<Vel+Vcath, the source electric potential Vs of the driving transistor 1B is substantially equal to the low electric potential Vcc_L, and thus the organic EL element 1D is set to be in a reverse-biased state and quenched.

Figure 4C:
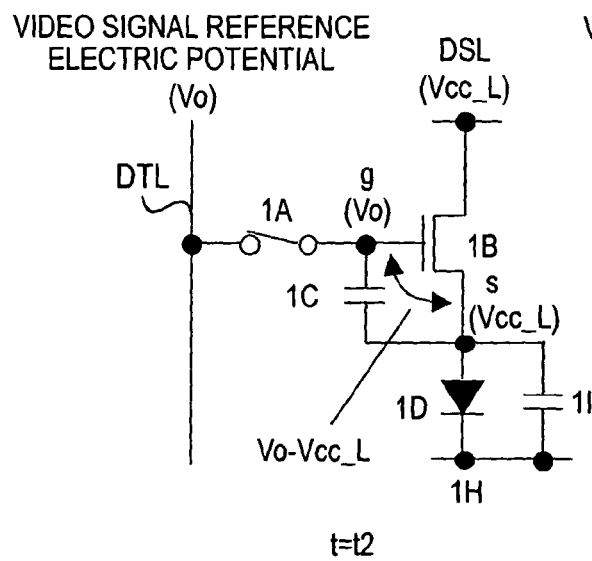

Next, at time t2, as the electric potential WS of the scanning line WSL makes a transition from a low electric potential side to a high electric potential side, as shown in FIG. 4C, the writing transistor 1A is set in a conducting state. At this moment, since the signal line reference electric potential Vo is supplied from the horizontal driving circuit 103 to the signal line DTL, the gate electric potential Vg of the driving transistor 1B becomes the signal line reference electric potential Vo. The source electric potential Vs of the driving transistor 1B is the electric potential Vcc_L that is sufficiently lower than the signal line reference electric potential Vo.

At this moment, the gate-to-source voltage Vgs of the driving transistor 1B is Vo–Vcc_L. Here, when Vo–Vcc_L is not higher than the threshold voltage Vth of the driving transistor 1B, a threshold value correcting operation to be described later may not be performed. Accordingly, the electric potential relation may need to be set such that Vo−Vcc_L>Vth. As described above, an initialization operation of respectively fixing (determining) the gate electric potential Vg and the source electric potential Vs of the driving transistor 1B to the signal line reference electric potential Vo and the low electric potential Vcc_L is a threshold value correction preparatory operation.

Threshold Value Correcting Period for First Time

Figure 4D:
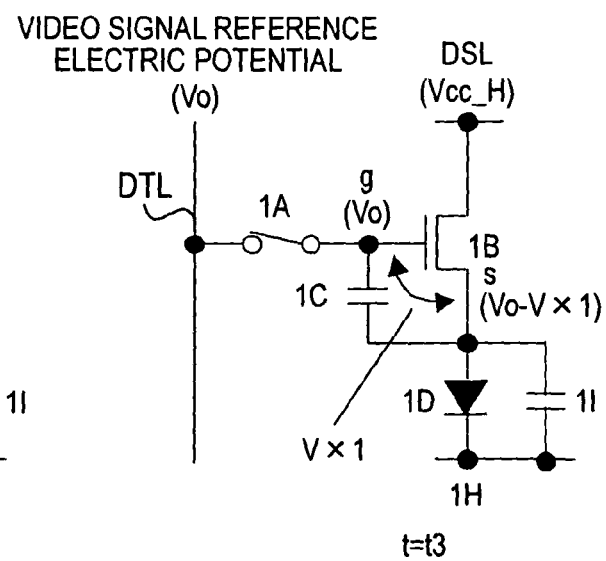

Next, as shown in FIG. 4D, when the electric potential DS of the power supply line DSL shifts from the low electric potential Vcc_L to the high electric potential Vcc_H at time t3, the source electric potential Vs of the driving transistor 1B starts to rise, and a threshold value correcting period for the first time starts. During the threshold value correcting period for the first time, the source electric potential Vs of the driving transistor 1B rises. Accordingly, the gate-to-source voltage Vgs of the driving transistor 1B becomes a predetermined electric potential Vx1, and the electric potential Vx1 is maintained at the holding capacitor 1C.

Figure 5A:
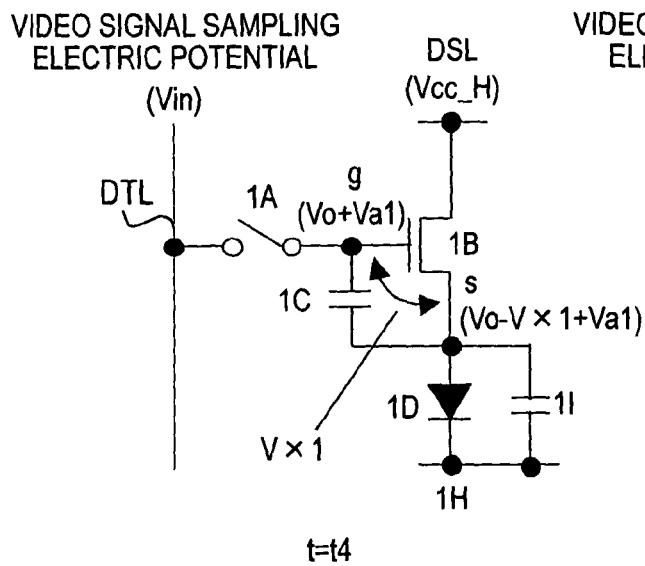
FIGS. 5A to 5D are explanatory diagrams (second example) illustrating the circuit operation of an organic EL display device of the active matrix type that serves as a premise of an embodiment of the invention.

Subsequently, at time t4 that is start of a latter part of the horizontal period (1H), as shown in FIG. 5A, the signal voltage Vin of the video signal is supplied to the signal line DTL from the horizontal driving circuit 103, whereby the electric potential of the signal line DTL makes a transition from the signal line reference electric potential Vo to the signal voltage Vin. During this period, writing signal voltages Vin into pixels of another row is performed.

At this moment, in order not to write the signal voltage Vin into pixels of the current row, the electric potential WS of the scanning line WSL is allowed to make a transition from the high electric potential side to the low electric potential side, whereby the writing transistor 1A is to be in a non-conducting state. Accordingly, the gate electrode of the driving transistor 1B is cut off from the signal line DTL to be in a floating state.

Here, when the gate electrode of the driving transistor 1B is in the floating state, the holding capacitor 1C is connected between the gate and the source of the driving transistor 1B. Thus, when the source electric potential Vs of the driving transistor 1B changes, the gate electric potential Vg of the driving transistor 1B also changes in accordance (follow) with the change in the source electric potential Vs. This is a bootstrap operation that is performed by the holding capacitor 1C.

Also after time t4, the source electric potential Vs of the driving transistor 1B continues to rise so as to rise by Va1 (Vs=Vo−Vx1+Va1). At this moment, the gate electric potential Vg also rises by Va1 in accordance with the rise in the source electric potential Vs of the driving transistor 1B by the bootstrap operation (Vg=Vo+Va1).

Threshold Value Correcting Period for Second Time

Figure 5B:
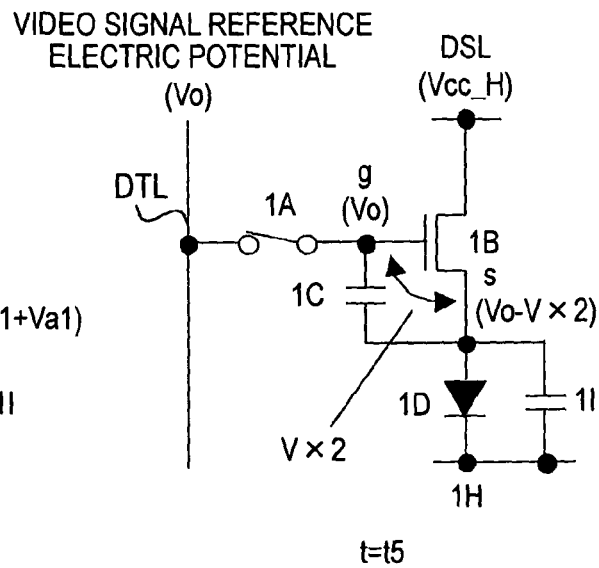

When the next horizontal period begins at time t5, as shown in FIG. 5B, the electric potential WS of the scanning line WSL shifts from the low electric potential side to the high electric potential side, and the writing transistor 1A is in the conducting state. Simultaneously, the signal line reference electric potential Vo instead of the signal voltage Vin is supplied to the signal line DTL from the horizontal driving circuit 103, and a threshold value correcting period for the second time begins.

During the threshold value correcting period for the second time, the writing transistor 1A is in the conducting state, and thus the signal line reference electric potential Vo is written. Accordingly, the gate electric potential Vg of the driving transistor 1B is initialized back to the signal line reference electric potential Vo. The source electric potential Vs drops in accordance with a drop in the gate electric potential Vg at that moment. Then, again, the source electric potential Vs of the driving transistor 1B starts to rise.

Then, as the source electric potential Vs of the driving transistor 1B rises during the threshold value correcting period for the second time, the gate-to-source voltage Vgs of the driving transistor 1B becomes a predetermined electric potential Vx2, and this electric potential Vx2 is maintained in the holding capacitor 1C.

Figure 5C:
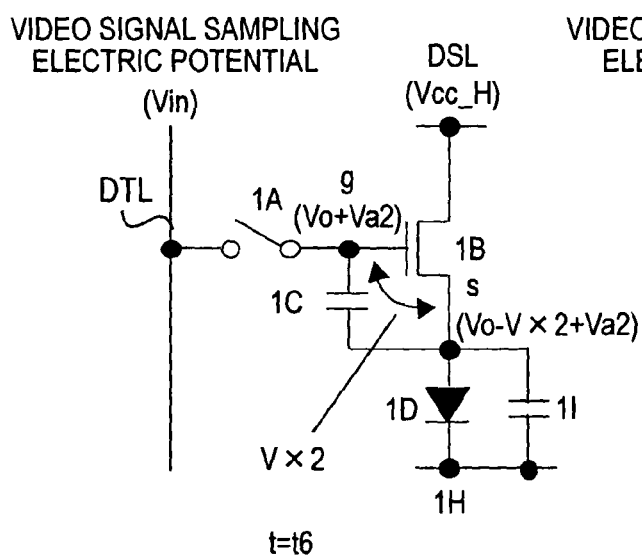

Subsequently, at time t6 when a latter part of this horizontal period begins, as shown in FIG. 5C, as the signal voltage Vin of the video signal is supplied from the horizontal driving circuit 103 to the signal line DTL, the electric potential of the signal line DTL is allowed to make a transition from the offset voltage V0 to the signal voltage Vin. During this period, the signal voltage Vin is written into pixels of another row (the next row of the row being written at the previous time).

At this moment, in order not to perform writing the signal voltage Vin into the pixels of the current row, the electric potential WS of the scanning line WSL is allowed to make a transition from the high electric potential side to the low electric potential side, whereby the writing transistor 1A is in the non-conducting state. Accordingly, the gate electrode of the driving transistor 1B is cut off from the signal line DTL to be in a floating state.

Also after time t6, the source electric potential Vs of the driving transistor 1B continues to rise so as to rise by Va2 (Vs=Vo−Vx1+Va2). At this moment, by the bootstrap operation, the gate electric potential Vg rises by Va2 in accordance with a rise in the source electric potential Vs of the driving transistor 1B (Vg=Vo+Va2).

Threshold Value Correcting Period for Third Time

Figure 5D:
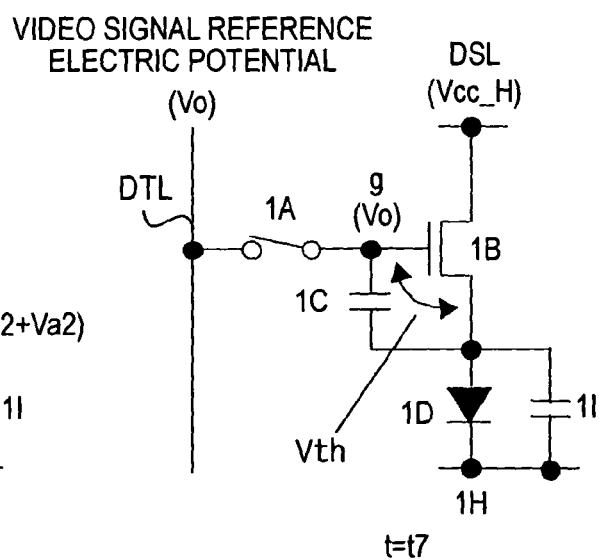

The next horizontal period begins at time t7, and, as shown in FIG. 5D, the electric potential WS of the scanning line WSL is allowed to make a transition from the low electric potential side to the high electric potential side, whereby the writing transistor 1A is in the conducting state. Simultaneously, the signal line reference electric potential Vo instead of the signal voltage Vin is supplied to the signal line DTL from the horizontal driving circuit 103, and a threshold value correcting period for the third time begins.

During this threshold value correcting period for the third time, as the writing transistor 1A is in the conducting state, the signal line reference electric potential Vo is written. Accordingly, the gate electric potential Vg of the driving transistor 1B is reinitialized to the signal line reference voltage Vo. In accordance with a drop in the gate electric potential Vg at that moment, the source electric potential Vs drops. Then, the source electric potential Vs of the driving transistor 1B starts to rise again.

As the source electric potential Vs of the driving transistor 1B rises, finally, the gate-to-source voltage Vgs of the driving transistor 1B converges at the threshold voltage Vth of the driving transistor 1B, whereby a voltage corresponding to the threshold voltage Vth is maintained in the holding capacitor 1C.

By performing the above-described threshold value correcting operations for three times, the threshold voltage Vth of the driving transistor 1B of each pixel is detected, and a voltage corresponding to the threshold voltage Vth is maintained in the holding capacitor 1C. In addition, during the threshold value correcting period for the three times, in order to allow a current to flow not to the organic EL element 1D side but only to the holding capacitor 1C side, the electric potential Vcath of the common power supply line 1H is set such that the organic EL element 1D is in the cut-off state.

Signal Writing Period and Mobility Correcting Period

Figure 6A:
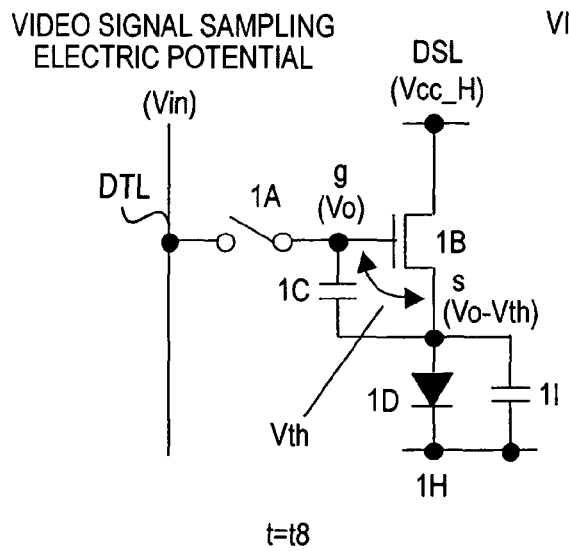
FIGS. 6A to 6C are explanatory diagrams (third example) illustrating the circuit operation of an organic EL display device of the active matrix type that serves as a premise of an embodiment of the invention.

Next, at time t8, as the electric potential WS of the scanning line WSL is allowed to make a transition to the low electric potential side, as shown in FIG. 6A, the writing transistor 1A is in the non-conducting state. Simultaneously, the electric potential of the signal line DTL is shifted from the offset voltage V0 to the video voltage Vin of the video signal.

As the writing transistor 1A is in the non-conducting state, the gate electrode of the driving transistor 1B is in a floating state. However, since the gate-to-source voltage Vgs is equal to the threshold voltage Vth of the driving transistor 1B, the driving transistor 1B is in the cut-off state. Accordingly, a drain-to-source current Ids does not flow in the driving transistor 1B.

Figure 6B:
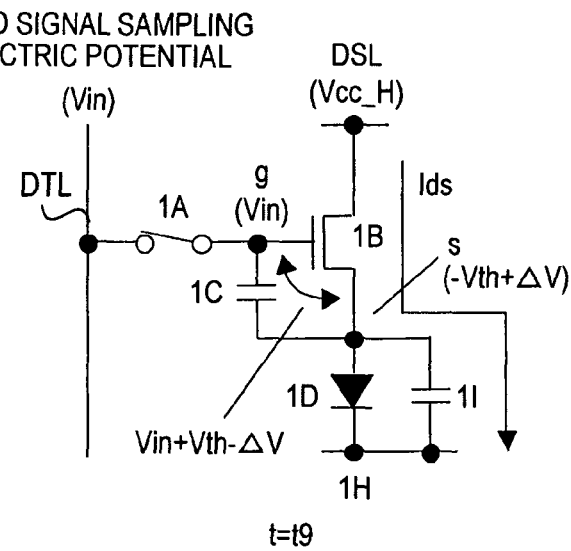

Subsequently, at time t9, as the electric potential WS of the scanning line WSL is allowed to make a transition to the high electric potential side, as shown in FIG. 6B, the writing transistor 1A is in the conducting state. Thus, the signal voltage Vin of the video signal is sampled so as to be written into the pixel 101. By writing the signal voltage Vin by using the writing transistor 1A, the gate electric potential Vg of the driving transistor 1B becomes the signal voltage Vin.

Then, when the driving transistor 1B is driven in accordance with the signal voltage Vin of the video signal, the threshold voltage Vth of the driving transistor 1B is offset by the threshold voltage Vth maintained in the holding capacitor 1C, whereby the threshold value correction is performed.

At this moment, since the organic EL element 1D is in the first cutoff state (high impedance state), a current (drain-to-source current Ids) flowing from the power supply line DSL to the driving transistor 1B in accordance with the signal voltage Vin of the video signal flows in the EL capacitance 1I of the organic EL element 1D, whereby charging of the EL capacitance 1I is started.

By charging the EL capacitance 1I, the source electric potential Vs of the driving transistor 1B rises over time. At this moment, since the deviation of the threshold voltage Vth of the driving transistor 1B has been already corrected (corrected for the threshold value), the drain-to-source current Ids of the driving transistor 1B depends on the mobility μ of the driving transistor 1B.

Finally, when the source electric potential Vs of the driving transistor 1B rises up to the electric potential of "Vo−Vth+ΔV", the gate-to-source voltage Vgs of the driving transistor 1B becomes "Vin+Vth−ΔV". In other words, an increase amount ΔV of the source electric potential Vs acts to be subtracted from the voltage (Vin+Vth−ΔV) maintained in the holding capacitor 1C, that is, to discharge electric charges charged in the holding capacitor 1C for applying a negative feedback. Accordingly, the increase amount ΔV of the source electric potential Vs becomes the feedback amount of the negative feedback.

As described above, by applying the drain-to-source current Ids flowing through the driving transistor 1B to the gate input of the driving transistor 1B, that is, the gate-to-source voltage Vgs as a negative feedback, mobility correction, in which the dependence of the drain-to-source current Ids of the driving transistor 1B on the mobility μ is eliminated, in other words, the deviation of the mobility μ for each pixel is corrected, is performed.

In particular, the higher the signal voltage Vin of the video signal is, the larger the drain-to-source current Ids becomes, and thus the absolute value of the feedback amount (correction amount) ΔV of the negative feedback is increased. Accordingly, the mobility correction is performed in accordance with the emission luminance level. In addition, when the signal voltage Vin of the video signal is constant, the absolute value of the feedback amount ΔV for the negative feedback is increased as the mobility μ of the driving transistor 1B is higher. Accordingly, the deviation of the mobility μ for each pixel can be eliminated.

Emission Period

Figure 6C:
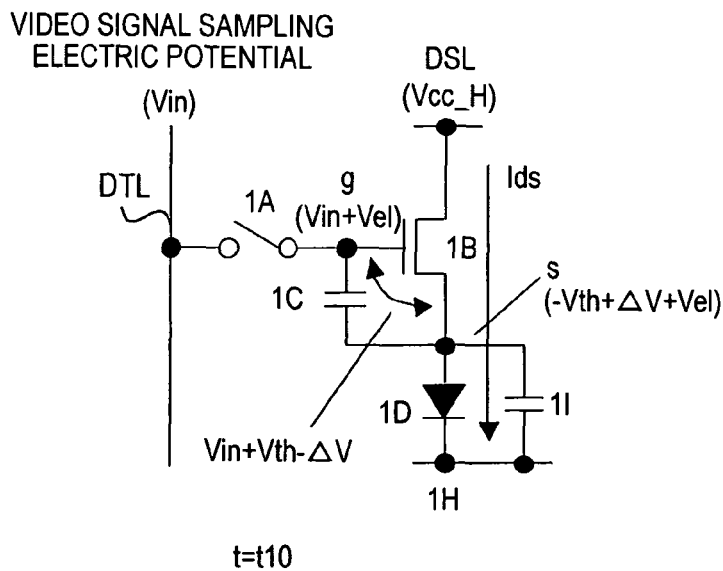

Next, at time t10, as the electric potential WS of the scanning line WSL makes a transition to the low electric potential side as shown in FIG. 6C, the writing transistor 1A is in a non-conducting state. Accordingly, the gate electrode of the driving transistor 1B is cut off from the signal line DTL so as to be in a floating state.

As the gate electrode of the driving transistor 1B is in the floating state, and simultaneously, the drain-to-source current Ids of the driving transistor 1B starts to flow through the organic EL element 1D, the anode electric potential of the organic EL element 1D rises in accordance with the drain-to-source current Ids of the driving transistor 1B.

The rise in the anode electric potential of the organic EL element 1D is not different from a rise in the source electric potential Vs of the driving transistor 1B. As the source electric potential Vs of the driving transistor 1B rises, the gate electric potential Vg of the driving transistor 1B also rises by the bootstrap operation of the holding capacitor 1C.

At this time, assuming that a bootstrap gain is one (ideal value), the amount of the rise in the gate electric potential Vg is equal to that in the source electric potential Vs. Thus the gate-to-source voltage Vgs of the driving transistor 1B is maintained to be constant at Vin+Vth−ΔV during the emission period. Then, at time t11, the electric potential of the signal line DTL shifts from the signal voltage Vin of the video signal to the signal line reference electric potential Vo.

As is apparent from the description of the operation as above, in this example, the threshold value correcting period is set to be over a total of 3 H periods including a 1 H period, in which signal writing and mobility correction are performed, and 2 H periods that precedes the 1 H period. Accordingly, a sufficient time can be acquired as the threshold value correcting period. Therefore, the threshold voltage Vth of the driving transistor 1B can be correctly detected and maintained in the holding capacitor 1C, whereby the threshold value correcting operation can be assuredly performed.

Here, the threshold value correcting period is set over the 3 H periods. However, this is only an example. Thus, as long as a sufficient time can be acquired by a 1 H period, in which signal writing and mobility correction are performed, as the threshold value correcting period, the threshold value correcting period may not need to be set over the preceding horizontal periods. On the other hand, when it is difficult to acquire a sufficient time by setting the threshold value correcting period to be over 3 H periods in a case where a 1 H period is shortened in accordance with an increase in the precision, the threshold value correcting period may be set over 4 H periods or more.

2. Problem in Pixel Structure in Related Art Layout of Pixel Circuit

Figure 7:
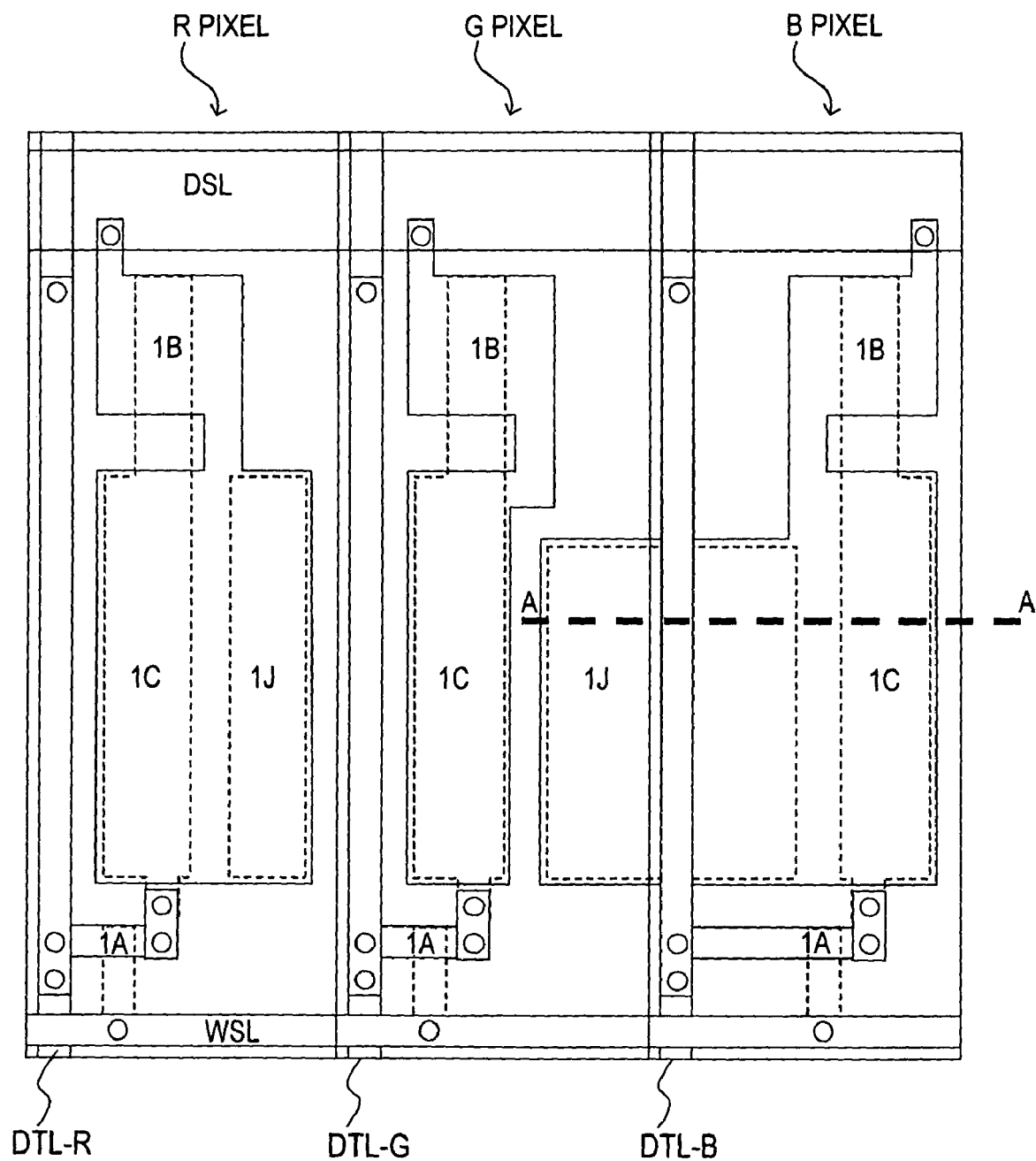
FIG. 7 is a schematic plan view illustrating a pixel structure in related art.

FIG. 7 is a schematic plan view illustrating a pixel structure in related art. FIG. 7 represents the disposition configuration of an R (red) pixel, a G (green) pixel, and a B (blue) pixel. Each pixel is configured between the power supply line DSL and the scanning line WSL that extend in the horizontal direction (horizontal direction in the figure), and areas of the RGB pixels are partitioned by signal lines DTL that extend in the vertical direction (the vertical direction in the figure).

Within the area of each pixel, a writing transistor 1A, a driving transistor 1B, and a holding capacitor 1C are disposed. In addition, an auxiliary capacitor 1J that is used for adjusting a writing gain or a mobility correcting time is also disposed.

In the example represented in FIG. 7, a case is shown where the pattern density of the G (green) pixel is lower than that of the R (red) pixel, and the pattern density of the B (blue) pixel is higher than that of the R (red) pixel.

The signal lines DTL-R, DTL-G, and DTL_B are disposed at an equal pitch in the viewpoint of reflection of external light. Thus, a part of the auxiliary capacitor 1J that is a constituent element of the B (blue) pixel is configured to be set in the area of an adjacent G (green) pixel.

Here, the writing transistor 1A, the gate electrode of the driving transistor 1B, a lower electrode of the holding capacitor 1C that is conductive with the gate electrode, and a lower electrode of the auxiliary capacitor 1J that is conductive with the cathode electrode of the organic EL element are formed as a first wiring layer.

The power supply line DSL, the signal line DTL, and the scanning line WSL are formed as a second wiring layer. In addition, an intersection portion of the power supply line DSL and the signal line DTL and an intersection portion of the signal line DTL and the scanning line WSL are switched over to the first wiring layer through a contact hole.

In addition, the writing transistor 1A, the source and drain electrodes of the driving transistor 1B, the upper electrode of the holding capacitor 1C that is conductive with the source electrode of the driving transistor 1B (the anode electrode of the organic EL element), and the upper electrode of the auxiliary capacitor 1J are formed of polysilicon. The polysilicon is a middle layer that is disposed between the first wiring layer and the second wiring layer.

Figure 8:
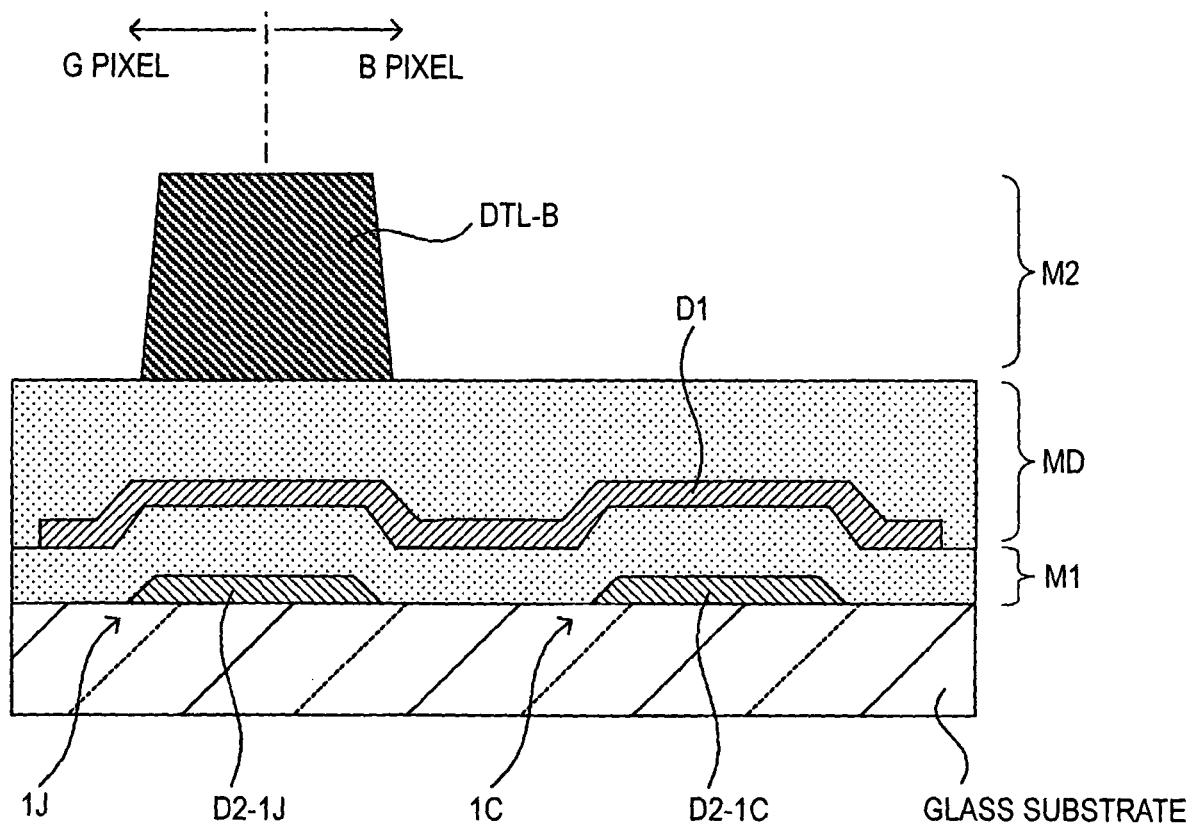
FIG. 8 is a cross-sectional view taken along line A-A shown in FIG. 7.

FIG. 8 is a schematic cross-sectional view taken along line A-A shown in FIG. 7. The pixel structure includes the first wiring layer M1, the second wiring layer M2, and the middle layer MD formed of polysilicon that are disposed on a glass substrate. As described above, a part of the auxiliary capacitor 1J of the B (blue) pixel is set to be in the area of the adjacent G (green) pixel. Thus, below the signal line DTL-B, an upper electrode D1 of the auxiliary capacitor 1J that is formed of polysilicon is disposed. In addition, since the upper electrode D1 is the same node as the upper electrode of the holding capacitor 1C of the B (blue) pixel, the upper electrode D1 is arranged commonly with the upper electrode of the holding capacitor 1C of the B pixel.

Equivalent Circuit

Figure 9:
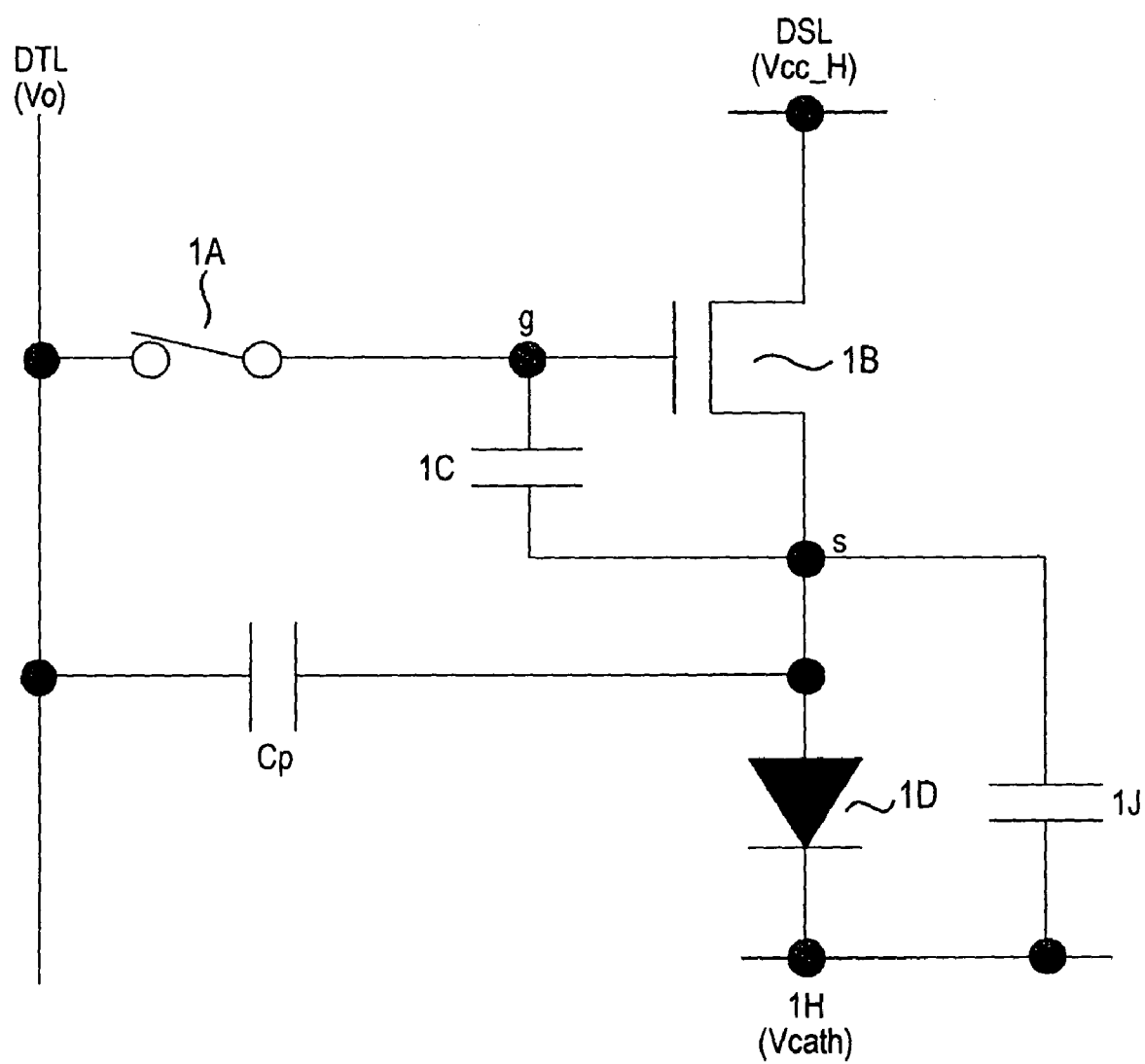
FIG. 9 is an equivalent circuit of a pixel unit of the pixel structure represented in FIG. 7.

FIG. 9 is an equivalent circuit of a pixel unit of the pixel structure represented in FIG. 7. The signal line DTL is connected to the writing transistor 1A, and the source electrode or the drain electrode of the writing transistor 1A is connected to the gate electrode (node g) of the driving transistor 1B.

To the drain electrode of the driving transistor 1B, the power supply line DSL is connected, and the holding capacitor 1C is connected between the gate electrode and the source electrode. The source electrode of the driving transistor 1B is connected to the anode electrode of the organic EL element 1D. In addition, the auxiliary capacitor 1J is connected between the anode and cathode electrodes of the organic EL element 1D.

In the above-described circuit, the signal line DTL configured as the second wiring layer and the anode electrode (node s) of the organic EL element 1D, which is formed of polysilicon, configured as the middle layer form a parallel plate capacitor, whereby parasitic capacitance Cp is formed therein.

Timing Chart

Figure 10:
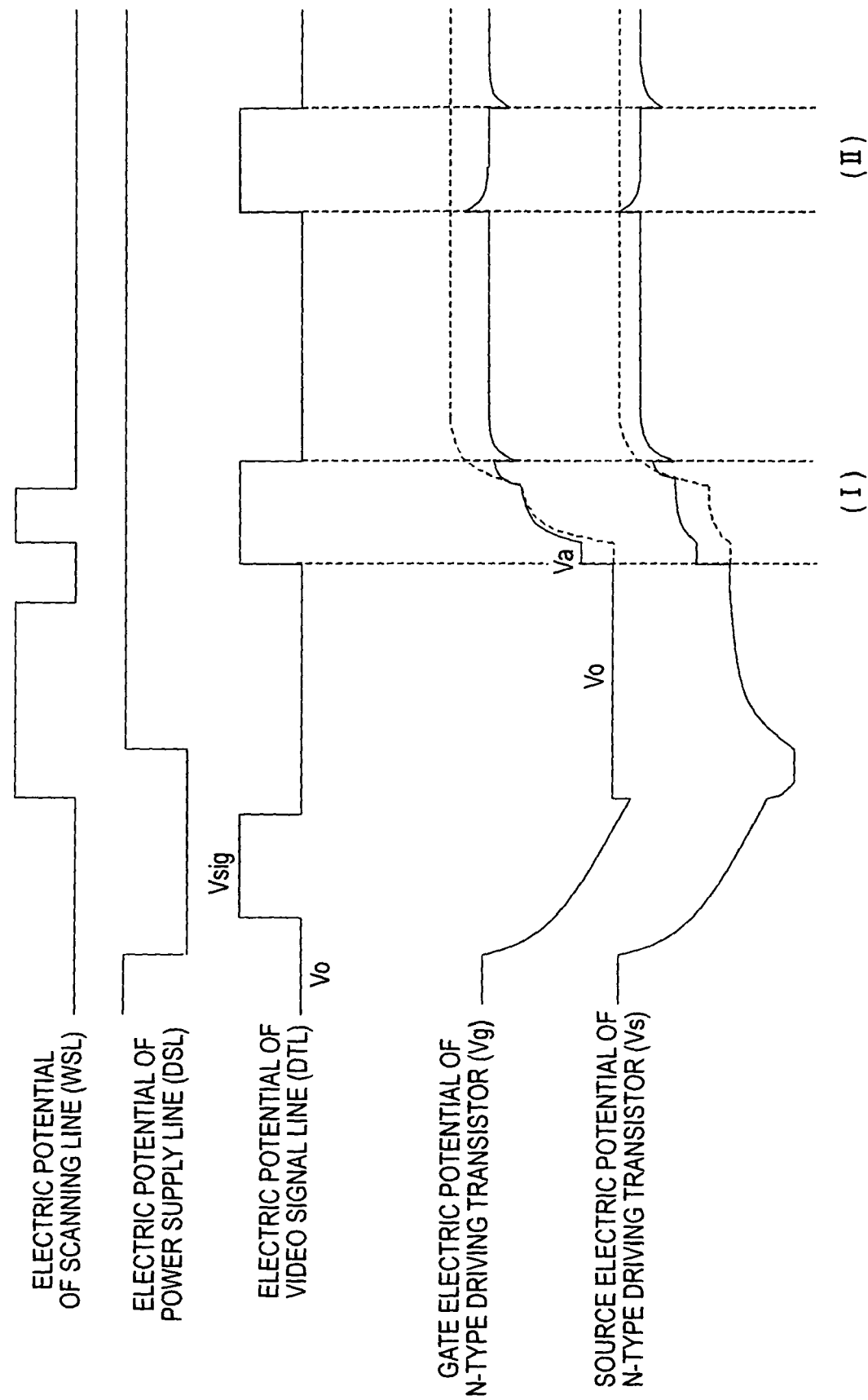
FIG. 10 is a timing chart illustrating the operation of a circuit diagram represented in FIG. 9.

FIG. 10 is a timing chart illustrating the operation of the circuit diagram represented in FIG. 9. In the figure, waveforms denoted by broken lines represent original variances in the electric potential, and solid lines represent variances in the electric potential according to the circuit diagram represented in FIG. 9.

In the circuit diagram represented in FIG. 9, parasitic capacitor Cp is formed between the signal line DTL and the anode electrode (node s). Thus, when the electric potential of the signal line DTL is shifted, capacitive coupling is overlapped in the anode, that is, the source (node s) of the driving transistor 1B.

In period (I), when the signal line DTL is shifted from the video signal reference electric potential Vo to the video signal Vsig prior to sampling of the video signal, capacitive coupling occurs between the signal line DTL and the anode electrode (node s). Accordingly, the electric potential of the source (node s) of the driving transistor 1B rises up by an amount corresponding to a capacitance ratio from the electric potential after completion of the threshold value correcting. Similarly, in accordance with the rise in the electric potential of the source of the driving transistor 1B, the electric potential of the gate (node g) of the driving transistor 1B also rises up from the video signal reference electric potential Vo by the bootstrap operation.

Next, the sampling of the video signal is started in the state in which the electric potential is raised up. Accordingly, not the original input amplitude of "Vin=Vsig−Vo" but an input amplitude of "Vin=Vsig−Va" (here, Va>Vo) is input. Accordingly, the gate-to-source voltage of the driving transistor 1B drops, whereby the luminance is decreased. Since the capacitive coupling during period (II) occurs in the state in which a current flows through the organic EL element 1D, the electric potential is returned to its original electric potential after the capacitive coupling.

3. Configuration Example of this Embodiment System Configuration

Figure 11:
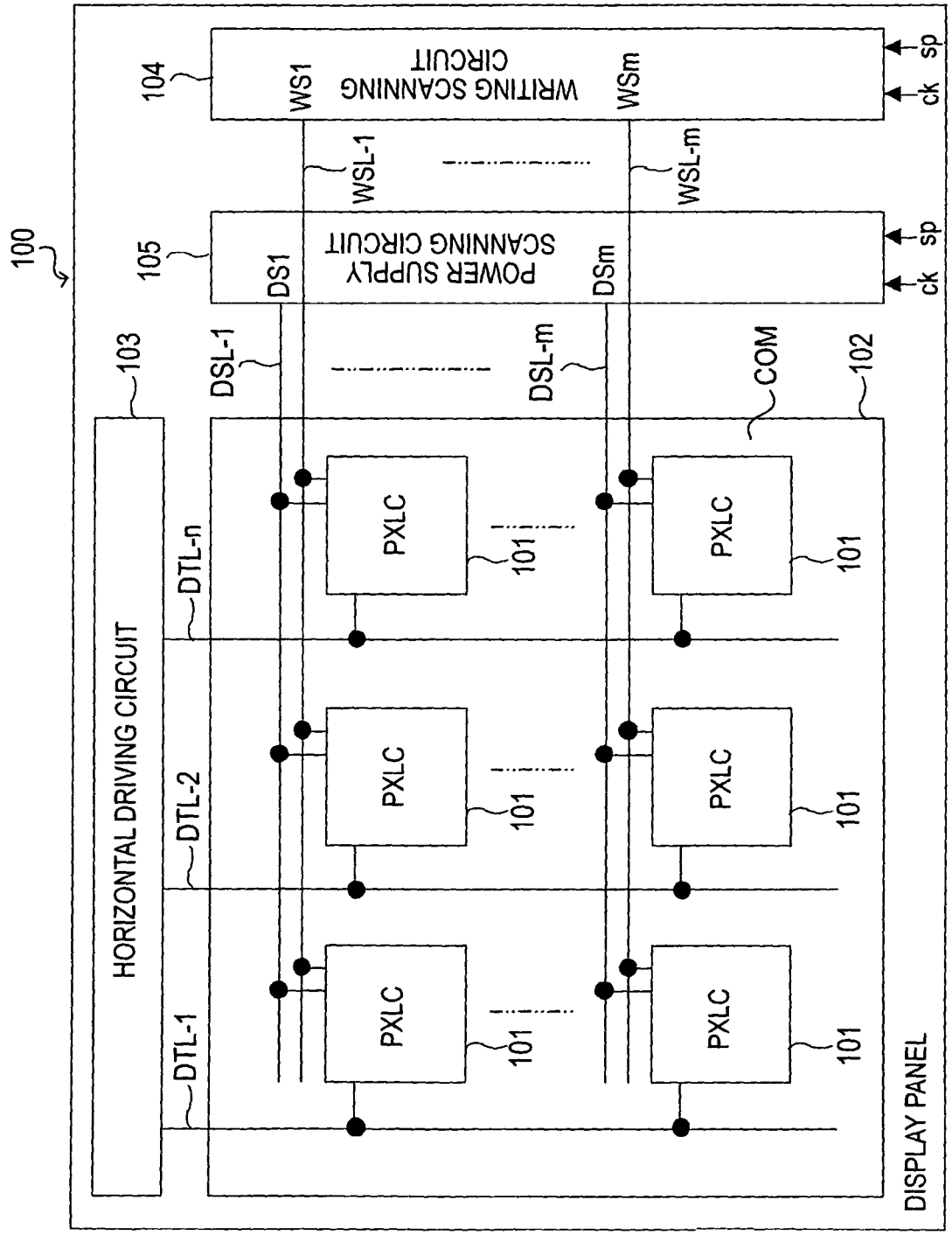
FIG. 11 is a diagram of the system configuration representing one example of this embodiment.

FIG. 11 is a diagram of the system configuration representing one example of this embodiment. As represented in FIG. 11, an organic EL display device 100 has a configuration including a pixel array unit 102 formed by two-dimensionally disposing pixels (PXLC) 101 in a matrix shape and a driving unit that is disposed on the periphery of the pixel array unit 102 and drives each pixel 101. As the driving unit that drives the pixels 101, for example, a horizontal driving circuit 103, a writing scanning circuit 104, and a power supply scanning circuit 105 are disposed.

In the pixel array unit 102, in the pixel array of m rows and n columns, scanning lines WSL-1 to WSL-m and power supply lines DSL-1 to DSL-m are wired for each pixel row, and signal lines DTL-1 to DTL-n are wired for each pixel column. The configuration of these components is the same as that represented in FIG. 1.

Wiring Structure

Figure 12:
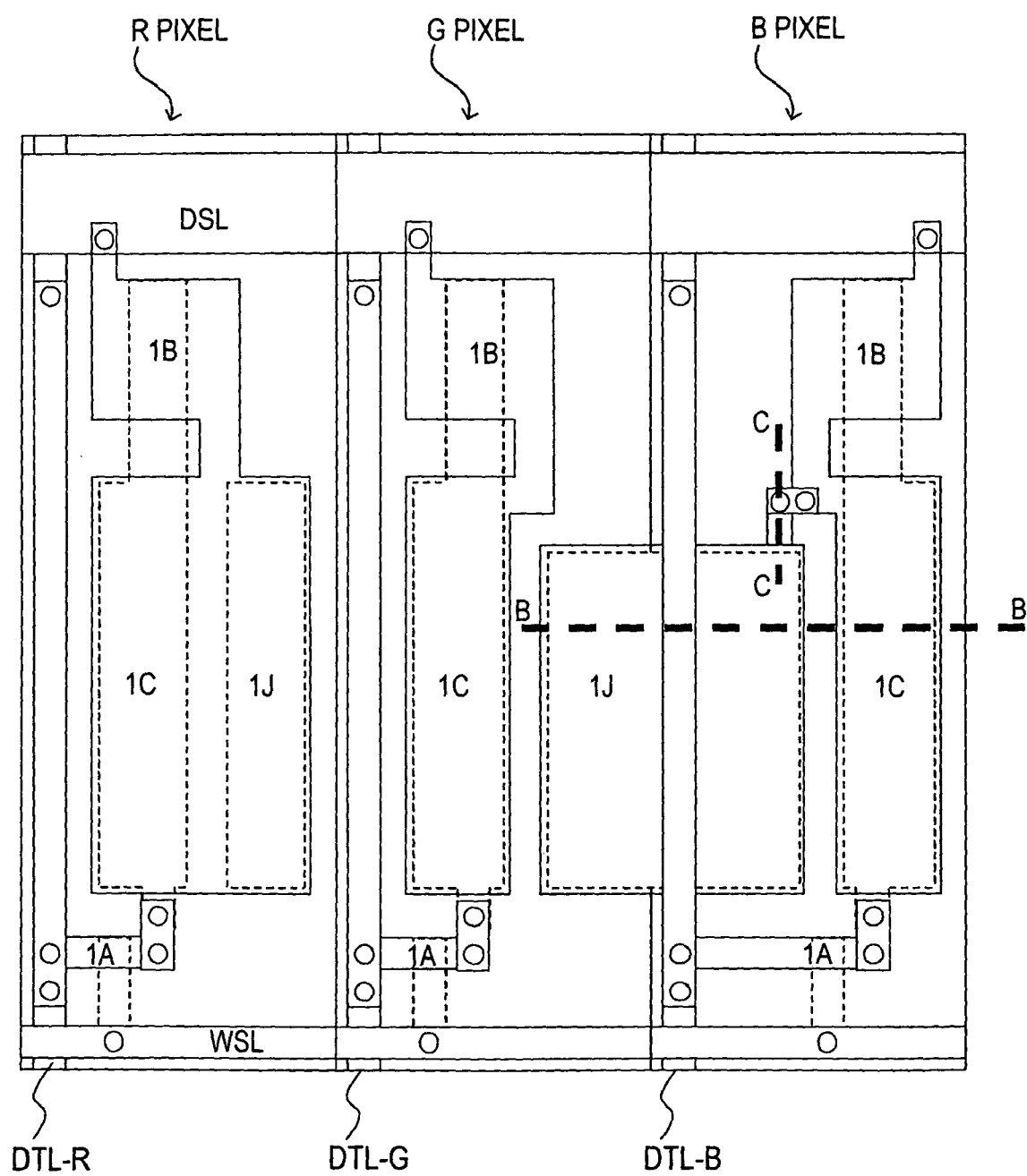
FIG. 12 is a schematic plan view illustrating the pixel structure according to this embodiment.

FIG. 12 is a schematic plan view illustrating the pixel structure according to this embodiment. FIG. 12 represents the disposition configuration of an R (red) pixel, a G (green) pixel, and a B (blue) pixel. Each pixel is configured between a power supply line DSL and a scanning line WSL that extend in the horizontal direction (the horizontal direction in the figure), and the area of each of RGB pixels is partitioned by the signal lines DTL extending in the vertical direction (the vertical direction in the figure).

Within the area of each pixel, a writing transistor 1A, a driving transistor 1B, and a holding capacitor 1C are disposed. In addition, an auxiliary capacitor 1J that is used for adjusting a writing gain or a mobility correcting time is also disposed.

In the example represented in FIG. 12, a case is shown where the pattern density of the G (green) pixel is lower than that of the R (red) pixel, and the pattern density of the B (blue) pixel is higher than that of the R (red) pixel.

The signal lines DTL-R, DTL-G, and DTL-B are disposed at an equal pitch in the viewpoint of reflection of external light. Accordingly, a part of the auxiliary capacitor 1J, which is a constituent element of the B (blue) pixel, is set in the area of the adjacent G (green) pixel.

Here, the writing transistor 1A, the gate electrode of the driving transistor 1B, the lower electrode of the holding capacitor 1C that is conductive with the gate electrode, and the lower electrode of the auxiliary capacitor 1J are formed as the first wiring layer.

In addition, the power supply line DSL, the signal line DTL, and the scanning line WSL are formed as the second wiring layer. In addition, an intersection portion of the power supply line DSL and the signal line DTL and an intersection portion of the signal line DTL and the scanning line WSL are switched over to the first wiring layer through a contact hole.

In addition, the writing transistor 1A, the source and drain electrodes of the driving transistor 1B, the upper electrode of the holding capacitor 1C that is conductive with the source electrode of the driving transistor 1B, and the upper electrode of the auxiliary capacitor 1J are formed of polysilicon. The polysilicon is a middle layer that is disposed between the first wiring layer and the second wiring layer.

In the above-described wiring configuration, according to this embodiment, the upper electrode (one electrode) of the auxiliary capacitor 1J and the cathode electrode of the organic EL element are allowed to be conductive with each other, and the lower electrode (the other electrode) of the auxiliary capacitor 1J and the anode electrode of the organic EL element are allowed to be conductive with each other.

In other words, in the pattern layout of the pixel structure according to this embodiment, when the auxiliary capacitor 1J passes the lower side of the signal line DTL, the upper electrode (one electrode), which is disposed on the signal line DTL side, of the electrodes of the auxiliary capacitor 1J is allowed to be conductive with the source electrode of the driving transistor 1B (the anode electrode (node s) of the organic EL element 1D) and is set as the first wiring layer. In addition, the lower electrode (the other electrode) of the auxiliary capacitor 1J is allowed to be conductive with the cathode 1H of the organic EL element 1D and is set as the middle layer formed of polysilicon.

Figure 13:
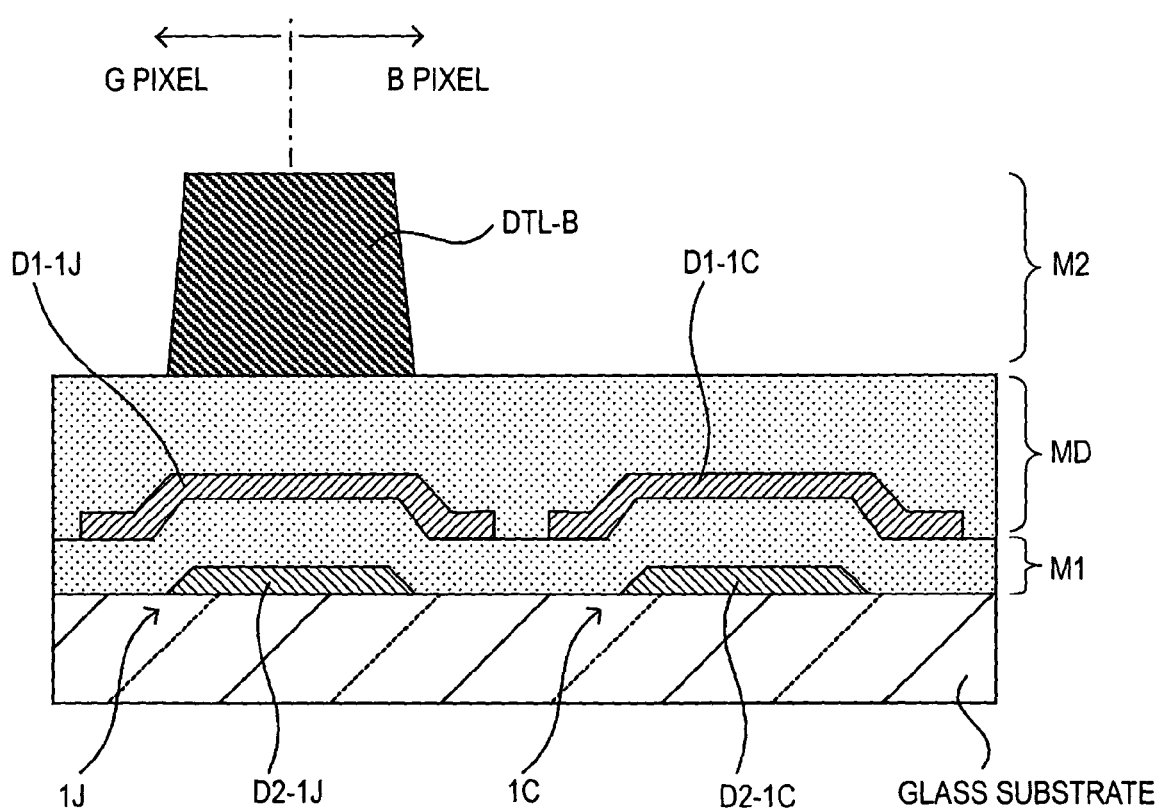
FIG. 13 is a schematic cross-sectional view taken along line B-B shown in FIG. 12.

FIG. 13 is a schematic cross-sectional view taken along line B-B shown in FIG. 12. The pixel structure includes the first wiring layer M1, the second wiring layer M2, and the middle layer MD formed of polysilicon that are disposed on a glass substrate. As described above, a part of the auxiliary capacitor 1J of the B (blue) pixel is set to be in the area of the adjacent G (green) pixel. Thus, below the signal line DTL-B, an upper electrode D1-1J of the auxiliary capacitor 1J that is formed of polysilicon is disposed. In addition, in the middle layer MD formed of polysilicon, an upper electrode D1-1C of the holding capacitor 1C of the B (blue) pixel is disposed.

In the above-described cross-sectional structure, according to this embodiment, the upper electrode D1-1J of the auxiliary capacitor 1J is allowed to be conductive with the cathode of the organic EL element, and the lower electrode D2-1J is allowed to be conductive with the anode.

Figure 14:
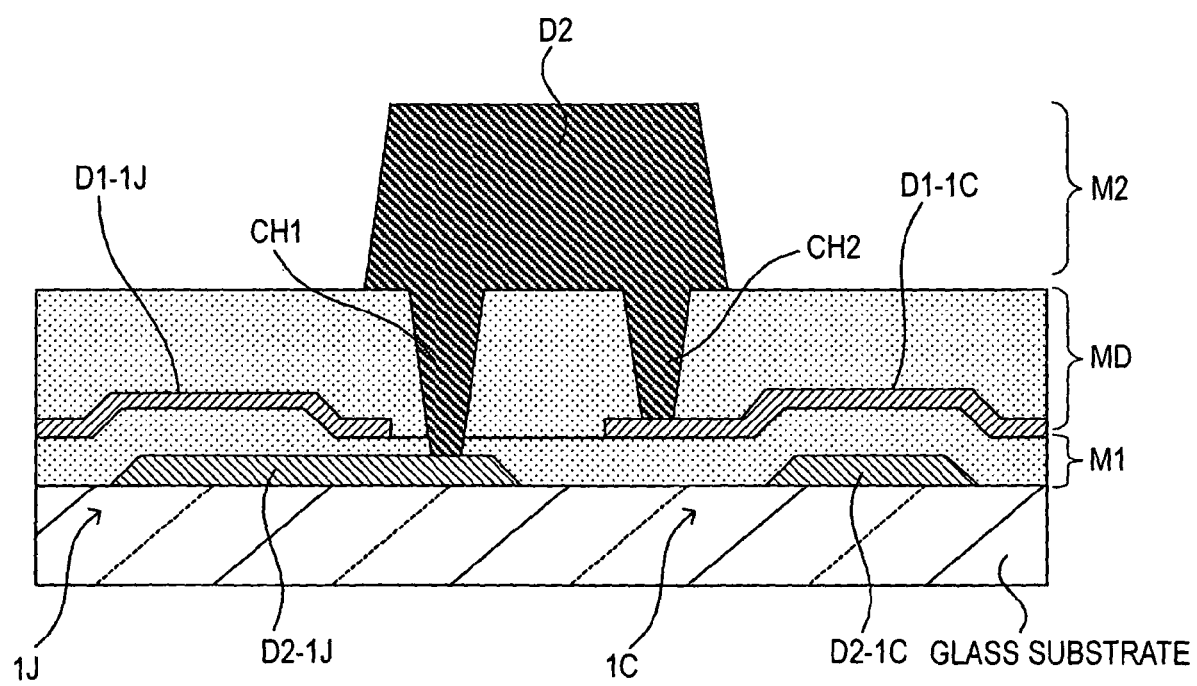
FIG. 14 is a schematic cross-sectional view taken along line C-C shown in FIG. 12.

FIG. 14 is a schematic cross-sectional view taken along line C-C shown in FIG. 12. According to this embodiment, the node of the upper electrode D1-1J of the auxiliary capacitor 1J and the node of the upper electrode D1-1C of the holding capacitor 1C are different to be separated from each other. In addition, the node of the lower electrode D2-1J of the auxiliary capacitor 1J and the node of the upper electrode D1-1C of the holding capacitor 1C are the same to be conductive with each other. In order to allow the electrodes to be conductive with each other, a contact hole CH1 is formed in the lower electrode D2-1J of the auxiliary capacitor 1J, a contact hole CH2 is formed in the upper electrode D1-1C of the holding capacitor 1C, and the lower electrode D2-1J of the auxiliary capacitor 1J and the upper electrode D1-1C of the holding capacitor 1C are connected to be conductive with each other through a wiring D2 disposed in the second wiring layer.

By using the above-described wiring structure, even when the auxiliary capacitor 1J is configured to pass below the signal line DTL-B, a shield can be configured between the signal line DTL-B and the anode (node s) by the cathode 1H. Accordingly, the parasitic capacitor Cp as represented in FIG. 9 is not formed between the signal line DTL-B and the anode-side electrode of the auxiliary capacitor 1J.

Timing Chart

Figure 15:
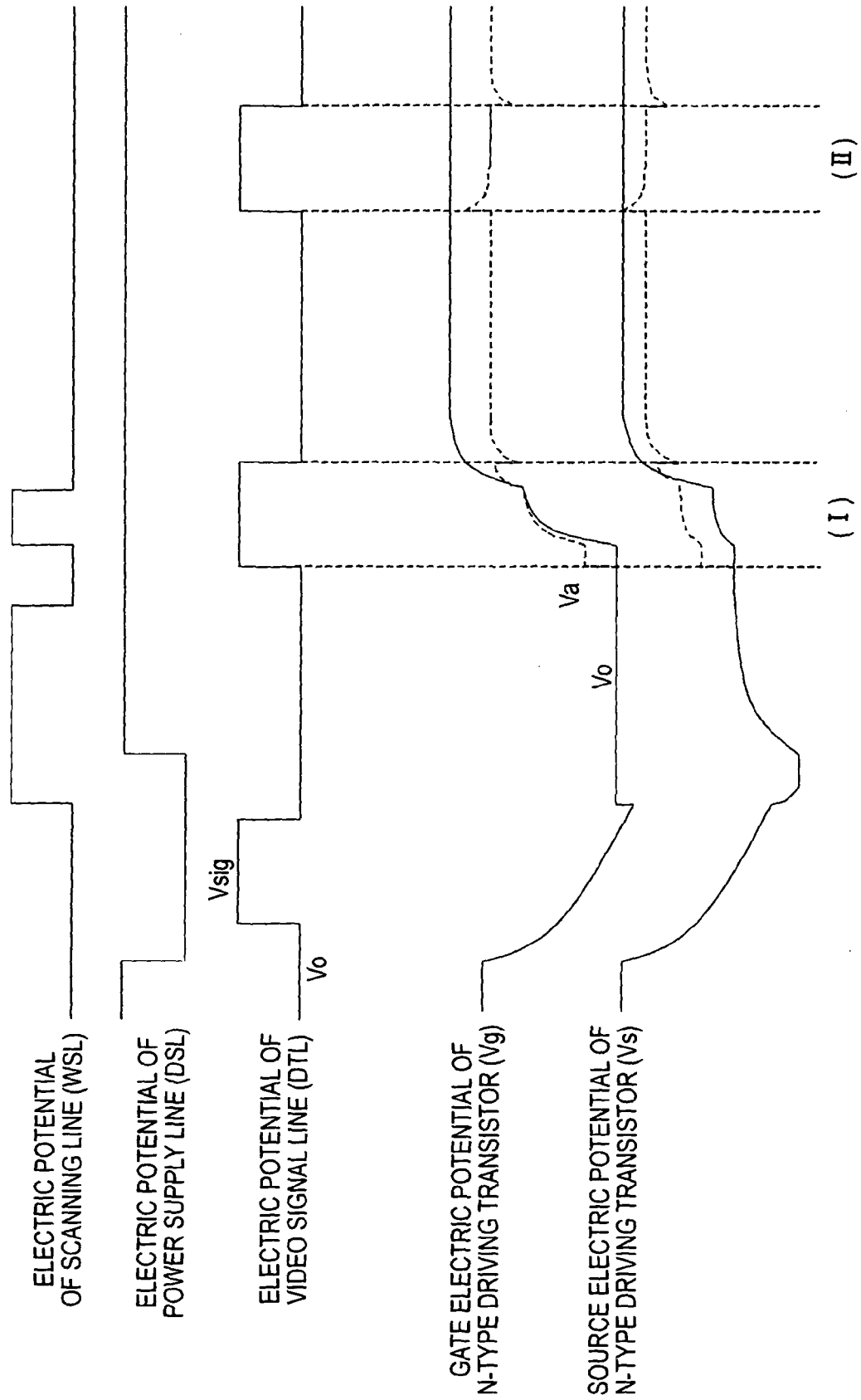
FIG. 15 is a timing chart illustrating the operation of the pixel configuration according to this embodiment.

FIG. 15 is a timing chart illustrating the operation of the pixel configuration according to this embodiment. In the figure, solid lines represent variances in the electric potentials in the pixel configuration of this embodiment, and broken lines represent variances in the electric potentials in a case where the parasitic capacitance Cp represented in the circuit diagrams of FIGS. 4A to 4D is included.

In a case where the parasitic capacitance Cp is included, when the electric potential of the video signal line DTL is switched, capacitive coupling overlaps in the anode, that is, the source (node s) of the driving transistor 1B. In period (I), when the signal line DTL is shifted from the video signal reference electric potential Vo to the video signal Vsig prior to sampling of the video signal, capacitive coupling occurs between the signal line DTL and the anode (node s). Accordingly, the electric potential of the source (node s) of the driving transistor 1B rises up by an amount corresponding to a capacitance ratio from the electric potential after completion of the threshold value correcting. Similarly, in accordance with the rise in the electric potential of the source of the driving transistor 1B, the electric potential of the gate g of the N-type driving transistor 1B also rises up from the video signal reference electric potential Vo by the bootstrap operation.

Next, the sampling of the video signal is started in the state in which the electric potential is raised up. Accordingly, not the original input amplitude of "Vin=Vsig-Vo" but an input amplitude of "Vin=Vsig-Va" (here, Va>Vo) is input. Accordingly, the gate-to-source voltage of the N-type driving transistor 1B drops, whereby the luminance is decreased.

On the other hand, according to this embodiment, the parasitic capacitance Cp is not formed. Thus, when the electric potential of the video signal line DTL is switched, the capacitive coupling does not overlap in the source (node s) of the driving transistor 1B. Accordingly, the source (node s) of the driving transistor 1B does not change after completion of the threshold value correction. Thus, the sampling of the video signal is started in the state in which the threshold value is corrected, and accordingly, the original input amplitude of "Vin=Vsig-Vo" is input, whereby a decrease in the luminance rarely occurs.

In the above-described embodiment, a case where the present invention is applied to an organic EL display device using an organic EL element as the electro-optical element of the pixel 101 represented in FIG. 11 has been described as an example. However, the present invention is not limited to such an application and may be applied to all the display devices that use an electro-optical element (light emitting element) of the current-driven type in which the emission luminance changes in accordance with the value of a current flowing through the device.

In addition, as the configuration of the pixel 101, a case where the pixel configuration of 2Tr/1C, in which two transistors (Tr) and one capacitor (C) are included, is used has been described as an example. However, the present invention is not limited thereto. Thus, the invention can be applied to a different pixel configuration such as a pixel configuration of 4Tr/1C in which four transistors (Tr) and one capacitor (C) are included.

4. Applications

The above-described display device according to this embodiment can be applied to various electronic apparatuses, for example, as represented in FIGS. 15 to 19. For example, the above-described display device can be used as a display device of electronic apparatuses in all the fields, in which a video signal input to the electronic apparatus or a video signal generated in the electronic apparatus is displayed as an image or a video, such as a digital camera, a notebook personal computer, a mobile terminal device including a cellular phone and the like, and a video camera.

As described above, by using the display device according to this embodiment as a display device of the electronic apparatuses in all the fields, the image quality of a display image can be improved. Accordingly, there is an advantage that a high-quality image display can be performed in various electronic apparatuses.

In addition, the display device according to this embodiment includes a display device having a sealed configuration in a module shape. For example, a display module that is formed by being attached to an opposing portion of a pixel array unit 102 such as transparent glass corresponds to such a display device. In the transparent opposing portion, a color filter, a protection film, or the like may be disposed, and the above-described light shield film may be additionally disposed. In addition, in the display module, a circuit unit used for input or output of a signal or the like to the pixel array unit from the outside, an FPC (flexible print circuit), or the like may be disposed.

Hereinafter, concrete examples of the electronic apparatus to which the display device according to this embodiment applies will be described.

Figure 16:
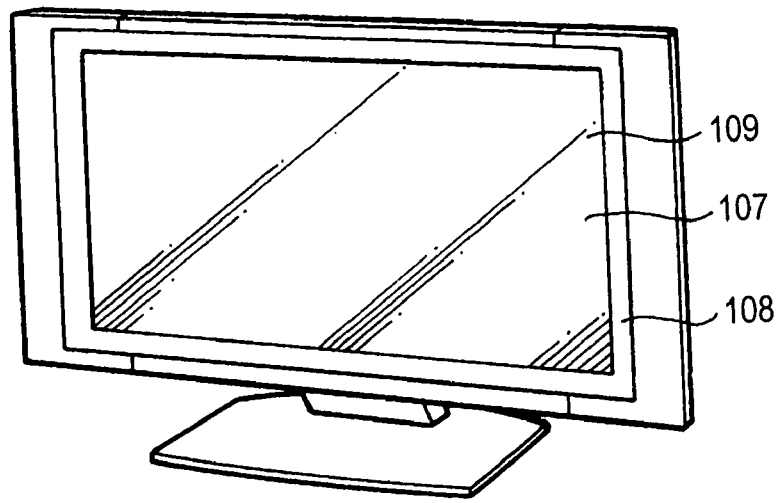
FIG. 16 is a perspective view showing the outer appearance of a television set to which this embodiment is applied.

FIG. 16 is a perspective view showing the outer appearance of a television set to which this embodiment is applied. The television set according to this application includes a video display screen unit 107 that is configured by a front panel 108, and a filter glass 109, and the like. By using the display device according to this embodiment as the video display screen unit 107, the television set is configured.

Figure 17A:
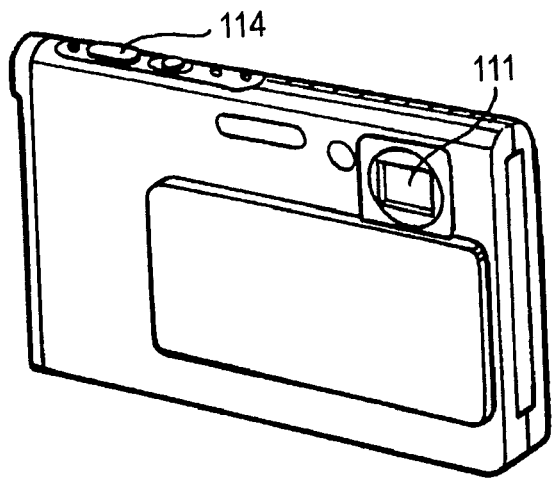
FIGS. 17A and 17B are perspective views showing the outer appearance of a digital camera to which this embodiment is applied.
Figure 17B:
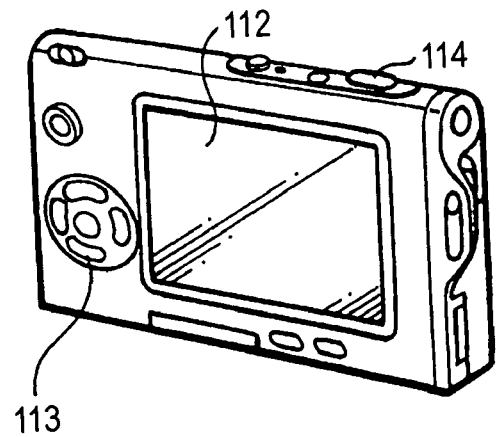

FIGS. 17A and 17B are perspective views showing the outer appearance of a digital camera to which this embodiment is applied. FIG. 17A is a perspective view viewed from the front side, and FIG. 17B is a perspective view viewed from the rear side. The digital camera according to this application includes a light emitting unit 111 for flash, a display unit 112, a menu switch 113, a shutter button 114, and the like. The digital camera is manufactured by using the display device according to this embodiment as the display unit 112.

Figure 18:
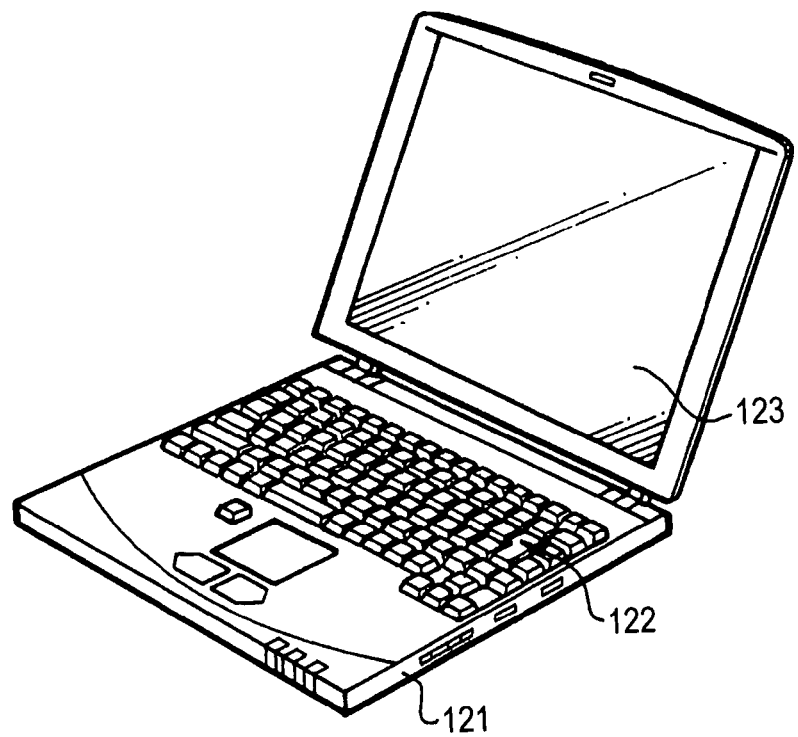
FIG. 18 is a perspective view showing the outer appearance of a notebook personal computer to which this embodiment is applied.

FIG. 18 is a perspective view showing the outer appearance of a notebook personal computer to which this embodiment is applied. The notebook personal computer according to this embodiment includes a keyboard 122 that is operated when a text or the like is input to a main body 121, a display unit 123 that displays an image, and the like. The notebook personal computer is manufactured by using the display device according to this embodiment as the display unit 123.

Figure 19:
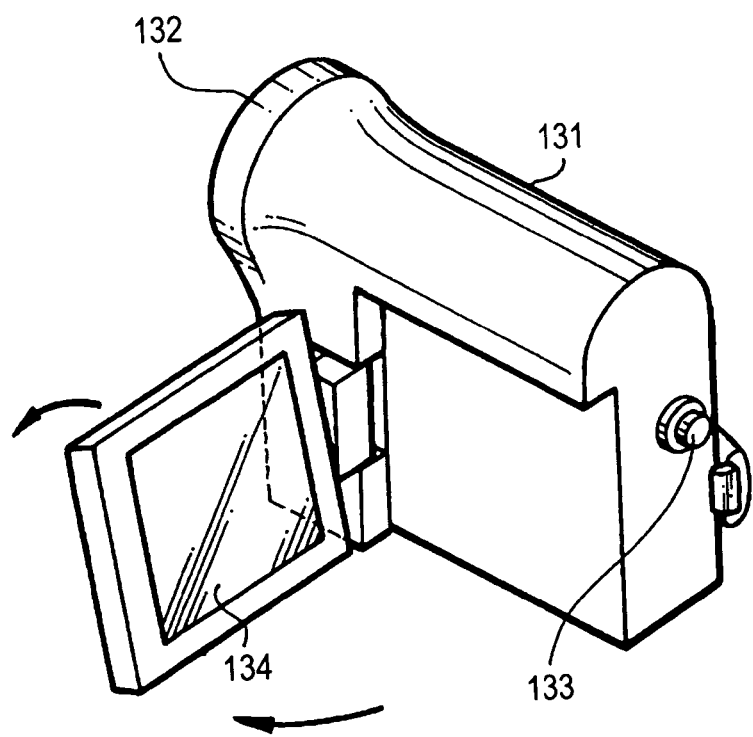
FIG. 19 is a perspective view showing the outer appearance of a video camera to which this embodiment is applied.

FIG. 19 is a perspective view showing the outer appearance of a video camera to which this embodiment is applied. The video camera according to this application includes a main body unit 131, a lens 132 disposed on a side facing the front side for photographing a subject, a start/stop switch 133 that is used for photographing, a display unit 134, and the like. By using the display device according to this embodiment as the display unit 134, the video camera is manufactured.

FIGS. 20A to 20G are diagrams showing the outer appearances of a mobile terminal device, to which this embodiment is applied, such as a cellular phone. FIG. 20A is a front view in an open state, FIG. 20B is a side view thereof, FIG. 20C is a front view in a closed state, FIG. 20D is a left side view, FIG. 20E is a right side view, FIG. 20F is a top view, and FIG. 20G is a bottom view. The cellular phone according to this application includes an upper casing 141, a lower casing 142, a connection portion (here, a hinge portion) 143, a display 144, a sub display 145, a picture light 146, a camera 147, and the like. By using the display device according to this embodiment as the display 144 or the sub display 145, the cellular phone is manufactured.

It should be understood by those skilled in the art that various modifications, combinations, sub-combinations and alterations may occur depending on design requirements and other factors insofar as they are within the scope of the appended claims or the equivalents thereof.

What is claimed is:

1. A display device comprising:
a pixel array unit having pixels including a circuit configuration, in which a first electrode of an electro-optical element and a source electrode of a driving transistor are connected together, a gate electrode of the driving transistor and a source electrode or a drain electrode of a writing transistor are connected together, a holding capacitor is connected between the gate electrode and the source electrode of the driving transistor, and an auxiliary capacitor is connected between the first electrode and a second electrode of the electro-optical element, the pixels disposed in a matrix shape,
wherein, a signal line used for transmitting a video signal is disposed between adjacent pixels of the pixels of the pixel array unit, and from a first pixel of the adjacent pixels to an area of a second pixel of the adjacent pixels, the auxiliary capacitor of the first pixel is disposed, and
one electrode of the auxiliary capacitor that is disposed on a side of the signal line side is electrically connected with the second electrode of the electro-optical element.

2. The display device according to claim 1,
wherein the gate electrode of the driving transistor and the other electrode of the auxiliary capacitor are disposed in a first wiring layer,
the signal line is disposed in a second wiring layer, and
the one electrode of the auxiliary capacitor is disposed in a middle layer that is disposed between the first wiring layer and the second wiring layer.

3. The display device according to claim 2, wherein the middle layer is formed of polysilicon.

4. The display device according to any one of claims 1 to 3, wherein the electro-optical element is an organic EL (Electroluminescence) element,
the first electrode is an anode electrode, and
the second electrode is a cathode electrode.

5. An electronic apparatus comprising:
a display device disposed in a main body casing, the display device including a pixel array unit having pixels including a circuit configuration, in which a first electrode of an electro-optical element and a source electrode of a driving transistor are connected together, a gate electrode of the driving transistor and a source electrode or a drain electrode of a writing transistor are connected together, a holding capacitor is connected between the gate electrode and the source electrode of the driving transistor, and an auxiliary capacitor is connected between the first electrode and a second electrode of the electro-optical element, the pixels disposed in a matrix shape,
wherein, a signal line used for transmitting a video signal is disposed between adjacent pixels of the pixels of the pixel array unit, and, from a first pixel of the adjacent pixels to an area of a second pixel of the adjacent pixels, the auxiliary capacitor of the one first pixel is disposed, and
one electrode of the auxiliary capacitor that is disposed on a side of the signal line is electrically connected with the second electrode of the electro-optical element.

* * * * *